US012812926B2

(12) United States Patent
Chen et al.

(10) Patent No.: US 12,812,926 B2
(45) Date of Patent: Nov. 24, 2026

(54) GATE ELECTRODE STRUCTURE IN MEDIUM VOLTAGE DEVICE FOR SCALING AND INCREASED PERFORMANCE

(71) Applicant: Taiwan Semiconductor Manufacturing Company, Ltd., Hsinchu (TW)

(72) Inventors: Yi-Huan Chen, Hsin Chu City (TW); Yu-Chang Jong, Hsinchu City (TW); Fei-Yun Chen, Hsinchu (TW); Chien-Chih Chou, Taipei City (TW); Chia-Jui Lee, Hsinchu County (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 350 days.

(21) Appl. No.: 18/519,393

(22) Filed: Nov. 27, 2023

(65) Prior Publication Data

US 2025/0176232 A1 May 29, 2025

(51) Int. Cl.
*H10D 62/10* (2025.01)
*H10D 62/13* (2025.01)
*H10D 64/27* (2025.01)

(52) U.S. Cl.
CPC ......... *H10D 62/116* (2025.01); *H10D 62/152* (2025.01); *H10D 62/156* (2025.01); *H10D 64/513* (2025.01)

(58) Field of Classification Search
CPC ............... H10D 64/513; H10D 64/514; H10D 64/519; H10D 84/0144; H10D 84/8314; H10D 30/605; H10D 30/608
See application file for complete search history.

(56) References Cited

U.S. PATENT DOCUMENTS

| | | | | |
|---|---|---|---|---|
| 9,741,850 | B1 * | 8/2017 | Hsiao | H10D 30/022 |
| 2008/0268602 | A1 | 10/2008 | Cheng et al. | |
| 2010/0221878 | A1 | 9/2010 | Yu et al. | |
| 2014/0001572 | A1 | 1/2014 | Bohr et al. | |
| 2016/0336242 | A1 | 11/2016 | Lee et al. | |
| 2016/0358919 | A1 * | 12/2016 | Chen | H10D 30/027 |
| 2017/0133377 | A1 | 5/2017 | Glass et al. | |
| 2018/0350801 | A1 * | 12/2018 | Chen | H10D 64/017 |

(Continued)

*Primary Examiner* — Bac H Au
(74) *Attorney, Agent, or Firm* — Eschweiler & Potashnik, LLC

(57) ABSTRACT

Various embodiments of the present disclosure are directed towards an integrated chip including an isolation structure extending into a front-side surface of a substrate. The isolation structure laterally encloses a first device region of the substrate. The isolation structure comprises a pair of isolation edges elongated in a first direction and at least partially defining the first device region. A pair of source/drain regions is disposed within the first device region and laterally spaced from one another in the first direction. A first gate electrode structure is disposed in the first device region between the pair of source/drain regions. The first gate electrode structure comprises a first pair of opposing sidewalls elongated in the first direction. The opposing sidewalls are laterally offset from a corresponding isolation edge in the pair of isolation edges by a non-zero distance in a direction towards a center of the first gate electrode structure.

20 Claims, 14 Drawing Sheets

(56) References Cited

U.S. PATENT DOCUMENTS

| | | | | |
|---|---|---|---|---|
| 2019/0148375 | A1* | 5/2019 | Lin | H10D 30/0227 257/394 |
| 2019/0378905 | A1* | 12/2019 | Lin | H10D 30/0227 |
| 2020/0335624 | A1 | 10/2020 | Fujimori | |
| 2021/0375666 | A1* | 12/2021 | Singh | H10D 30/67 |
| 2022/0102518 | A1* | 3/2022 | Chen | H10D 30/0223 |
| 2022/0293729 | A1* | 9/2022 | Lin | H10D 30/0221 |
| 2022/0367655 | A1* | 11/2022 | Chu | H10D 30/0212 |
| 2022/0415879 | A1 | 12/2022 | Lin et al. | |
| 2023/0275090 | A1 | 8/2023 | Tzeng et al. | |

* cited by examiner

GATE ELECTRODE STRUCTURE IN MEDIUM VOLTAGE DEVICE FOR SCALING AND INCREASED PERFORMANCE

BACKGROUND

Modern day integrated chips comprise millions or billions of semiconductor devices formed on a semiconductor substrate (e.g., silicon). Integrated chips utilize different types of semiconductor devices, depending on an application of the integrated chip. The integrated chip can have devices operating at different voltage levels and can include high voltage devices, medium voltage devices, and low voltage devices integrated on one chip. This facilitates the integrated chip performing various circuit functions such as memory buffering, logic processing, source drive, gate driver, etc.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
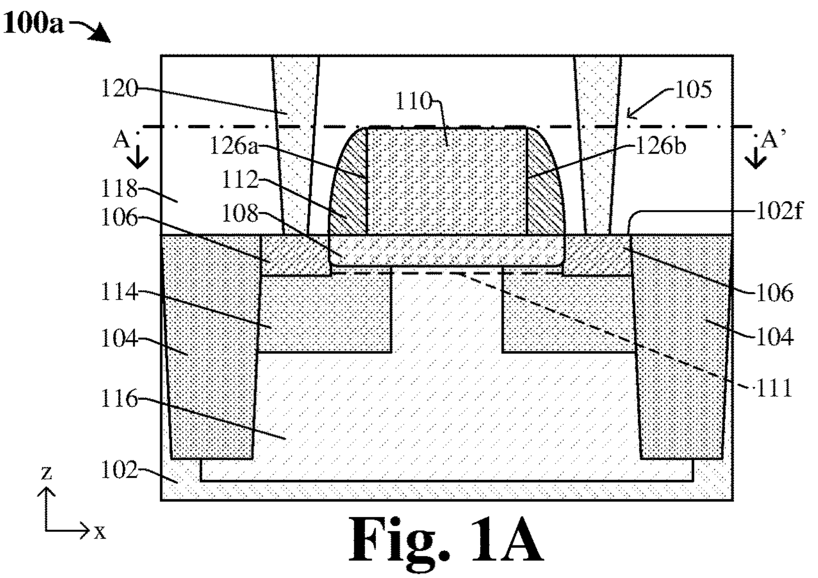
FIGS. 1A-1C illustrate various views of an integrated chip comprising a transistor having a gate electrode structure spaced between isolation edges of a shallow trench isolation (STI) structure.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

An integrated chip may include multiple devices operating at different voltage levels that are employed in a wide range of applications. The integrated chip can include low voltage (LV) devices (e.g., for memory or processing interfaces), medium voltage (MV) devices (e.g., for source driver), and high voltage (HV) devices (e.g., for gate driver) disposed on a same die. The MV devices may occupy a large area (e.g., about 70% or greater) of the die to support important chip functionalities, such as source drivers, digital-to-analog converters (DACs), and so on.

A MV device of the integrated chip is disposed on a semiconductor substrate of the integrated chip. A shallow trench isolation (STI) structure is disposed in the semiconductor substrate and comprises isolation edges demarcating a device region of the semiconductor substrate for the MV device. The MV device comprises a gate dielectric structure recessed in the semiconductor substrate, a gate electrode structure over the gate dielectric structure, and a pair of source/drain regions disposed on opposing sides of the gate electrode structure. A selectively-conductive channel of the MV device is disposed in the device region under the gate electrode structure and extends in a first direction between the pair of source/drain regions. The gate electrode structure extends over a first pair of isolation edges of the STI structure elongated in the first direction.

A challenge with the above integrated chip includes the large area occupied by the MV devices across the die and performance (e.g., noise, reliability, etc.) of the MV device. For example, charge carriers may be trapped at an interface between the first pair of isolation edges and the device region due to defects at the interface. Due to the gate electrode structure extending over the first pair of isolation edges, these trapped charge carriers cause noise in the MV device. Further, the gate dielectric structure is grown in a recess formed in the device region of the semiconductor substrate after forming the STI structure. Growth (e.g., by thermal oxidation) of the gate dielectric structure along or near the first pair of isolation edges is reduced compared to growth of the gate dielectric structure in a region of the recess offset from the STI structure. This reduces gate oxide integrity (GOI) of the MV device and results in the presence of one or more hump(s) in the gate electrode structure by the first pair of isolation edges that reduces device reliability and/or may result in delamination of the gate electrode structure. Furthermore, in an effort to shrink the large area occupied by the MV devices, the device region of each MV device may be scaled down. However, scaling the device region of each MV device may reduce the gate breakdown voltage, increase leakage current, and/or reduce a reliability of the MV device.

Accordingly, the present disclosure provides some embodiments of an integrated chip having a transistor including a gate electrode structure configured to reduced noise and increase reliability of the transistor. The integrated chip comprises an STI structure disposed in a substrate and demarcating a device region. The transistor is disposed in the device region and comprises the gate electrode structure overlying a gate dielectric structure and a pair of source/drain regions disposed in the device region on opposing sides of the gate electrode structure. The pair of source/drain regions are spaced from one another in a first direction. A first pair of isolation edges of the STI structure are elongated in the first direction. The gate electrode structure comprises a first pair of opposing sidewalls elongated in the first direction. The first pair of opposing sidewalls of the gate electrode structure are spaced between the first pair of isolation edges, such that the first pair of opposing sidewalls extending in the first direction do not directly overlie the STI structure. As a result of the spacing of the first pair of opposing sidewalls from the first pair of isolation edges, noise (e.g., due to trapped charge carriers at an interface between the STI structure and the device region) in the transistor is reduced, negative effects from reduced GOI at the interface between the STI structure and the device region is reduced, and one or more hump(s) in the gate electrode structure at the interface is mitigated or eliminated. In addition, the spacing of the first pair of opposing sidewalls of the gate electrode structure reduces a lateral footprint of the transistor while maintaining an area of the device region. This increases a device density of the integrated chip.

Figure 1B:
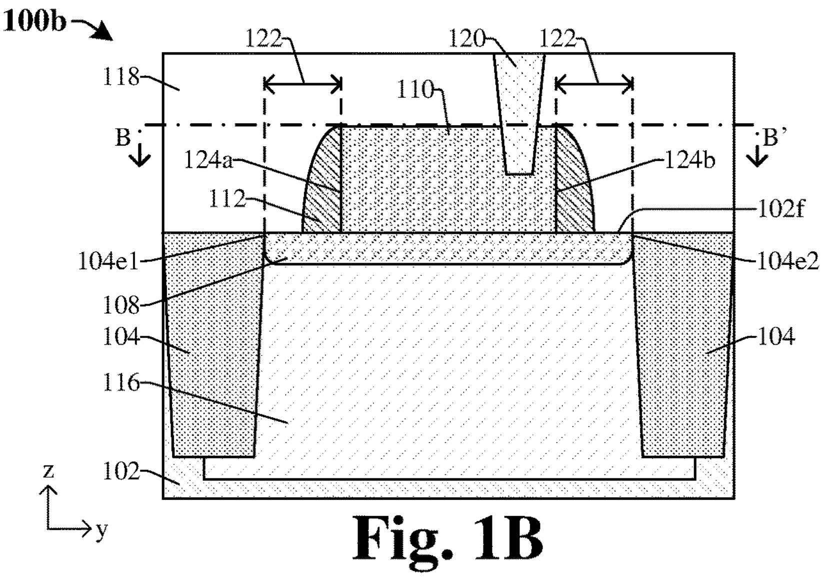
Figure 1C:
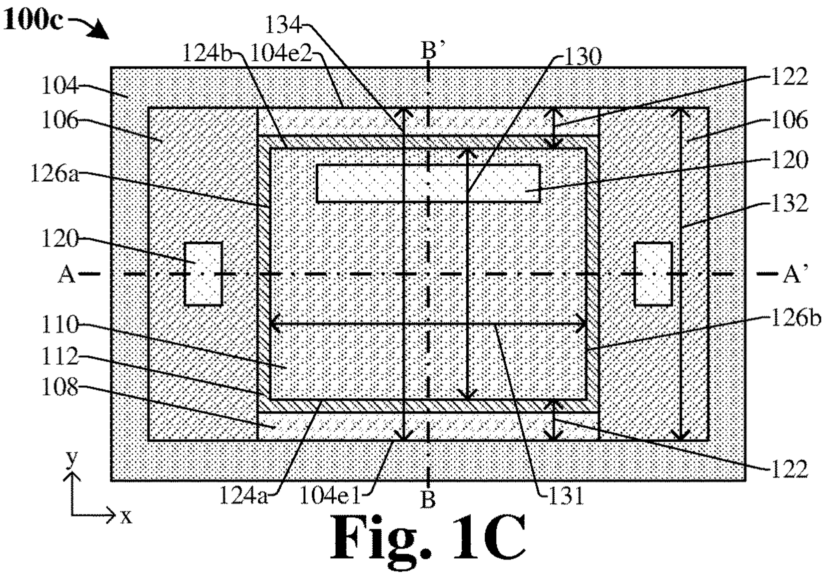

FIGS. 1A-1C illustrate various views of an integrated chip comprising a transistor 105 having a gate electrode structure 110 spaced between isolation edges **104*e*1, 104*e*2 of a shallow trench isolation (STI) structure 104. FIG. 1A illustrates a cross-sectional view 100*a* of some embodiments of the integrated chip taken along line A-A' of FIG. 1C. FIG. 1B illustrates a cross-sectional view 100*b* of some embodiments of the integrated chip taken along line B-B' of FIG. 1C. FIG. 1C illustrates a top view 100*c* of some embodiments of the integrated chip, where a dielectric structure 118 in FIGS. 1A and 1B is omitted from FIG. 1C** for ease of illustration.

The integrated chip includes the STI structure 104 extending into a front-side surface **102*f* of a substrate 102. The STI structure 104 demarcates a device region of the substrate 102. The transistor 105 is disposed on the substrate 102 and is spaced laterally within the device region. The transistor 105 comprises a gate dielectric structure 108 recessed into substrate 102, the gate electrode structure 110 over the gate dielectric structure 108, a sidewall spacer structure 112 disposed around the gate electrode structure 110, and a pair of source/drain regions 106 disposed in the substrate 102. Source/drain region(s) may refer to a source or a drain, individually or collectively dependent upon the contact. A well region 116 is disposed within the substrate 102 and underlies the transistor 105. The well region 116 comprises a first doping type (e.g., p-type). The source/drain regions 106 are spaced from one another in a first direction (e.g., along the x-axis). The source/drain regions 106 comprise a second doping type (e.g., n-type) opposite the first doping type. In some embodiments, the first doping type is p-type and the second doping type is n-type, or vice versa. Further, lightly doped regions 114 are disposed within the substrate 102 and abut a corresponding source/drain region in the pair of source/drain regions 106. The lightly doped regions 114 comprise the second doping type (e.g., n-type) with a lower doping concentration relative to the source/drain regions 106**.

In some embodiments, the gate dielectric structure 108 extends from a lower surface of the substrate 102 to the front-side surface **102*f* of the substrate 102. The gate dielectric structure 108 continuously laterally extends between the pair of source/drain regions 106 along the first direction. The dielectric structure 118 overlies the substrate 102. A plurality of conductive contacts 120 are disposed within the dielectric structure 118. The conductive contacts 120 facilitate electrical connections to the transistor 105. Upon receiving a bias voltage, the gate electrode structure 110 is configured to generate an electric field that controls the movement of charge carriers within a selectively-conductive channel region 111 directly below the gate electrode structure 110. The selectively-conductive channel region 111 extends along the first direction between the source/drain regions 106**.

With reference to FIGS. 1B and 1C, the gate electrode structure 110 comprises a first pair of opposing sidewalls **124*a-b* elongated in the first direction (e.g., along the x-axis) and a second pair of opposing sidewalls 126*a-b* elongated in a second direction (e.g., along the y-axis) orthogonal to the first direction. The second pair of opposing sidewalls 126*a-b* continuously extend between the first pair of opposing sidewalls 124*a-b*. Further, the source/drain regions 106 are adjacent to a corresponding sidewall in the second pair of opposing sidewalls 126*a-b*. The STI structure 104 comprises a pair of isolation edges 104*e*1, 104*e*2 elongated in the first direction (e.g., along the x-axis) that at least partially demarcate the device region. In various embodiments, when viewed in top view (e.g., as seen in FIG. 1C) the isolation edges 104*e*1-2 are line shaped and extend laterally in parallel with the first pair of opposing sidewalls 124*a-b*. In some embodiments, the isolation edges 104*e*1-2 are on opposing sides of the device region and have the same or substantially the same lengths. Further, the source/drain regions 106 each continuously laterally extend in the second direction (e.g., along the y-axis) between the isolation edges 104*e*1-2. The first pair of opposing sidewalls 124*a-b* of the gate electrode structure 110 are spaced laterally between the isolation edges 104*e*1-2. In some embodiments, the first pair of opposing sidewalls 124*a-b* are laterally offset from the isolation edges 104*e*1-2 by a non-zero distance 122**.

By spacing the gate electrode structure 110 from the isolation edges **104*e*1-2, the transistor 105 has reduced noise. For instance, the spacing mitigates trapped charge carriers at an interface between the STI structure 104 and the device region of the substrate 102 from contributing to a current flow across the selectively-conductive channel region 111, thereby decreasing noise (e.g., decreasing flicker noise). Further, proper growth of the gate dielectric structure 108 adjacent to the isolation edges 104*e*1-2 may be impeded due to the presence of the STI structure 104 and the selected growth process (e.g., a local oxidation of silicon (LOCOS) process). Spacing the gate electrode structure 110 from the isolation edges 104*e*1-2 mitigates negative effects from a reduced GOI of the gate dielectric structure 108 at the interface and mitigates the presence of one or more hump(s) in the gate electrode structure 110, thereby mitigating delamination of the gate electrode structure 110 and increasing a reliability of the transistor 105. Furthermore, the spacing facilitates decreasing a size of the gate electrode structure 110 and decreasing a lateral footprint of the transistor 105. As such, spacing the gate electrode structure 110 from the isolation edges 104*e*1-2** increases a device density and overall performance of the integrated chip.

With reference to FIG. 1C, a length 130 of the gate electrode structure 110 is less than a length 132 of the pair of source/drain regions 106. Further, a length 134 of the gate dielectric structure 108 is greater than the length 130 of the gate electrode structure 110. In further embodiments, a width 131 of the gate electrode structure 110 is greater than the length 130 of the gate electrode structure 110. In some embodiments, the length 134 of the gate dielectric structure 108 is equal to the length 132 of the pair of source/drain regions 106. In some embodiments, the distance 122 is, for example, within a range of about 0.01 to 0.1 micrometers (um) or some other suitable value. In various embodiments, the distance 122 being greater than 0.01 um facilitates reducing noise and negative effects from the reduced GOI of the gate dielectric structure 108 at the isolation edges **104*e*1-2. In further embodiments, the distance 122 being less than 0.1 um facilitates reducing noise and negative effects from the reduced GOI of the gate dielectric structure 108 while maintaining a sufficient size of the gate electrode structure 110 over the device region of the transistor 105. This, in part, facilitates the gate electrode structure 110 generating the electric field that controls the movement of charge carriers within the selectively-conductive channel region (111 of FIG. 1A). In further embodiments, the gate electrode structure 110 is completely laterally offset from the STI structure 104. In yet further embodiments, the gate electrode structure 110 does not directly overlie any segment of the STI structure 104**.

In some embodiments, the STI structure 104 may, for example, be or comprise silicon dioxide, silicon nitride, silicon oxynitride, some other dielectric material, or any combination of the foregoing. The gate dielectric structure 108 may, for example, be or comprise silicon dioxide, high-k dielectric material(s) (e.g. aluminum oxide, hafnium oxide, zirconium oxide, etc.), some other dielectric material, or any combination of the foregoing. As used herein, a high-k dielectric material is a dielectric material with a dielectric constant greater than 3.9. The gate electrode structure 110 may, for example, be or comprise polysilicon, doped polysilicon, metal material(s) (e.g., one or more of tungsten, titanium, tantalum, aluminum, etc.), a metal nitride (e.g., titanium nitride, tantalum nitride, etc.), or any combination of the foregoing. The substrate 102 may, for example, be or comprise silicon, germanium, silicon germanium, epitaxial silicon, some other semiconductor material, or the like. The transistor 105 may be, for example, a metal-oxide-semiconductor field-effect transistor (MOSFET).

Figure 2A:
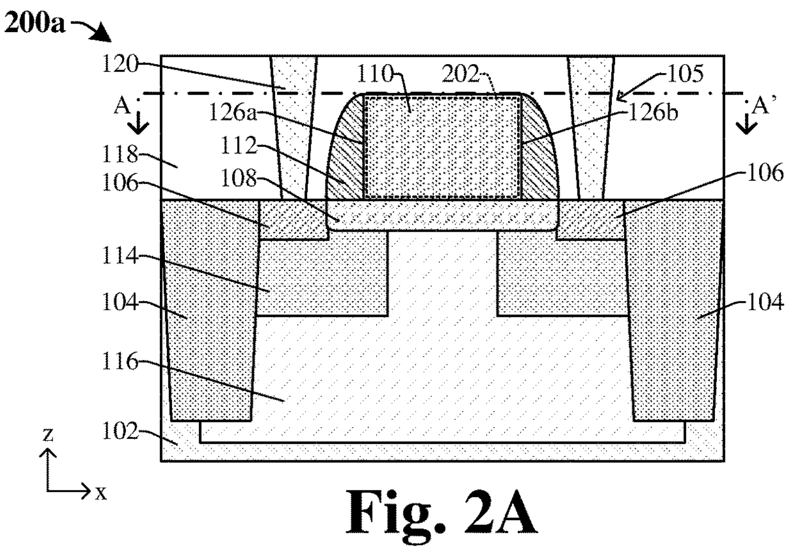
FIGS. 2A-2C and 3A-3C illustrate various views of some other embodiments of the integrated chip of FIGS. 1A-1C.
Figure 2B:
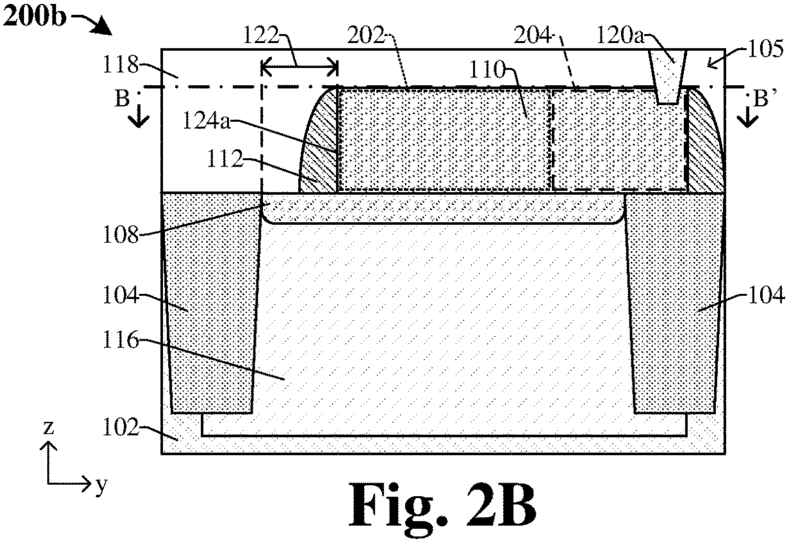
Figure 2C:
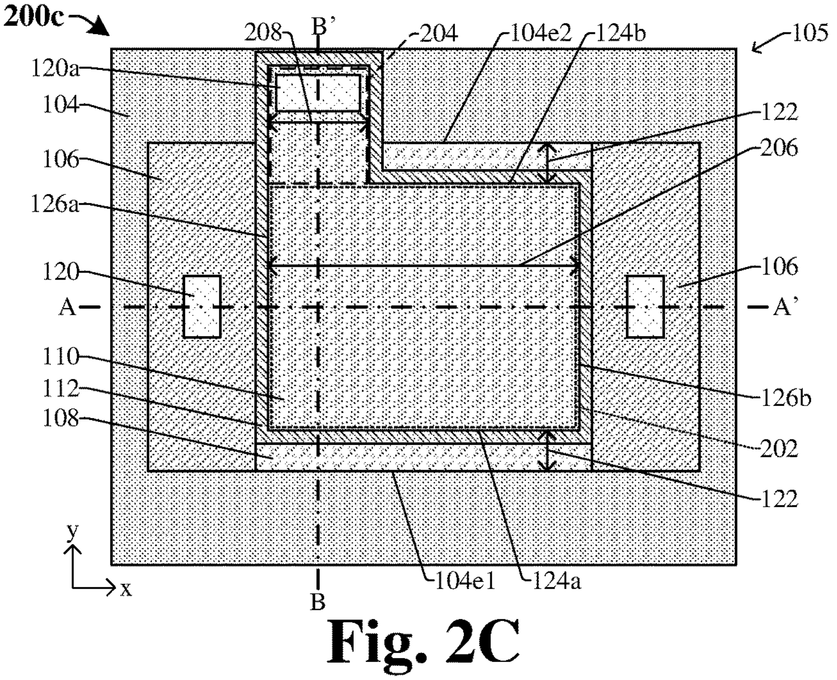

FIGS. 2A-2C illustrate various views of some other embodiments of the integrated chip of FIGS. 1A-1C. FIG. 2A illustrates a cross-sectional view **200*a* of some embodiments of the integrated chip taken along line A-A' of FIG. 2C. FIG. 2B illustrates a cross-sectional view 200*b* of some embodiments of the integrated chip taken along line B-B' of FIG. 2C. FIG. 2C illustrates a top view 200*c* of some embodiments of the integrated chip, where the dielectric structure 118 in FIGS. 2A and 2B is omitted from FIG. 2**C for ease of illustration.

With reference to FIGS. 2B and 2C, the first pair of opposing sidewalls **124*a-b* of the gate electrode structure 110 includes a first sidewall 124*a* and a second sidewall 124*b*. In some embodiments, the gate electrode structure 110 comprises a body region 202 and a protrusion 204. The body region 202 is defined between the first sidewall 124*a* and the second sidewall 124*b*. The protrusion 204 extends from the second sidewall 124*b* to a point over the STI structure 104. In some embodiments, the protrusion 204 directly overlies the STI structure 104. In various embodiments, a first conductive contact 120*a* directly overlies the protrusion 204 of the gate electrode structure 110 and is electrically coupled to the gate electrode structure 110. In further embodiments, a width 206 of the body region 202 is greater than a width 208 of the protrusion 204. Disposing the first conductive contact 120*a* over the protrusion 204 facilitates providing an electrical connection to the gate electrode structure 110 in a region laterally offset from the device region of the transistor 105. As a result, issues related to misalignment of the first conductive contact 120*a* (e.g., the first conductive contact 120*a* landing on the source/drain regions 106 and/or other regions of the substrate 102) over the gate electrode structure 110 may be mitigated. This, in part, improves an overall performance of the transistor 105**.

Figure 3A:
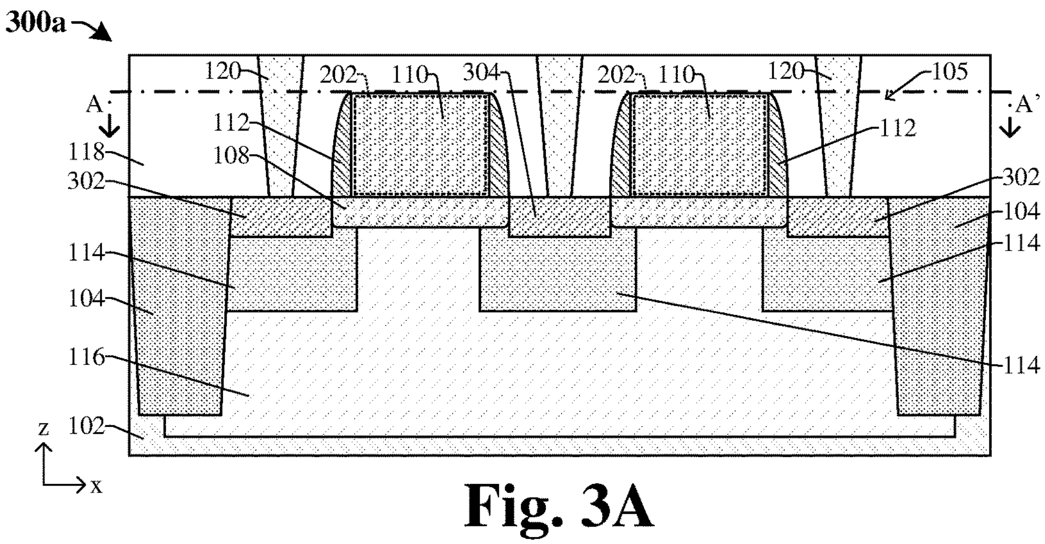
Figure 3B:
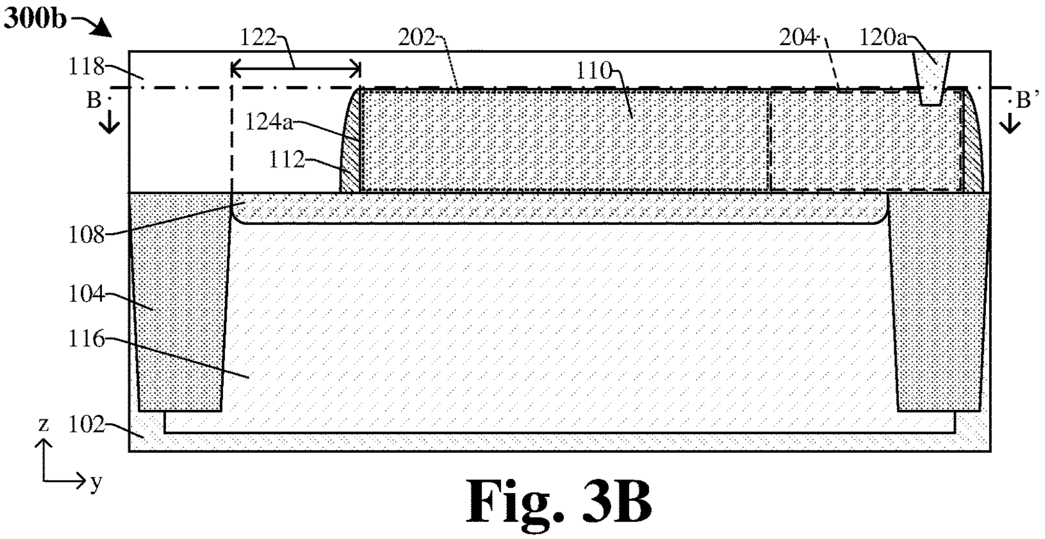
Figure 3C:
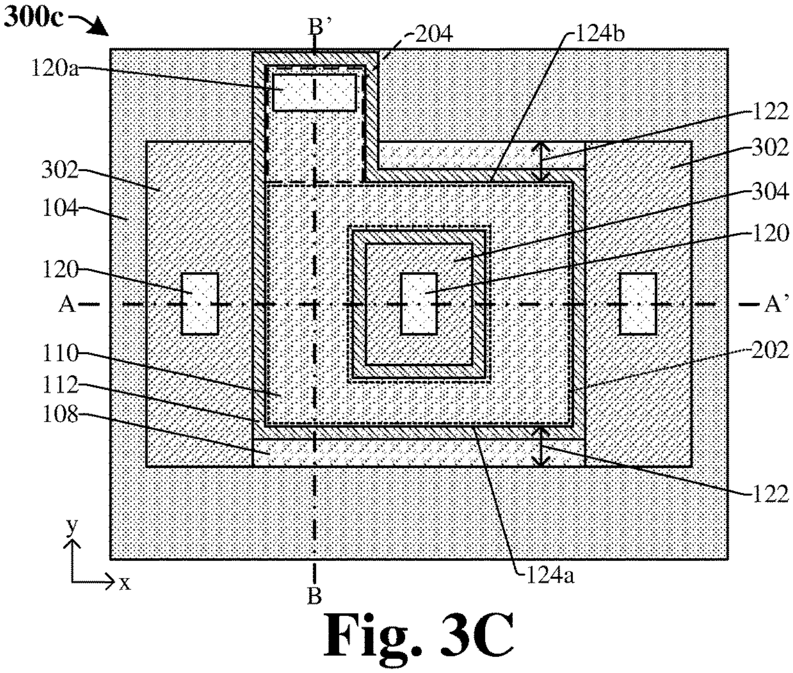

FIGS. 3A-3C illustrate various views of some other embodiments of the integrated chip of FIGS. 2A-2C. FIG. 3A illustrates a cross-sectional view **300*a* of some embodiments of the integrated chip taken along line A-A' of FIG. 3C. FIG. 3B illustrates a cross-sectional view 300*b* of some embodiments of the integrated chip taken along line B-B' of FIG. 3C. FIG. 3C illustrates a top view 300*c* of some embodiments of the integrated chip, where the dielectric structure 118 in FIGS. 3A and 3B is omitted from FIG. 2**C for ease of illustration.

In some embodiments, the transistor 105 comprises a drain region 302 and a source region 304 disposed within the substrate 102. In various embodiments, the body region 202 of the gate electrode structure 110 is ring-shaped and laterally encloses the source region 304. Further, the drain region 302 is disposed on opposing sides of the gate electrode structure 110. In some embodiments, the drain region 302 comprises two discrete doped regions of the substrate 102 that are spaced from one another in the first direction (e.g., along the x-axis). In yet further embodiments, the drain region 302 is ring-shaped and extends around an outer perimeter of the body region 202 of the gate electrode structure 110 (not shown).

Figure 4A:
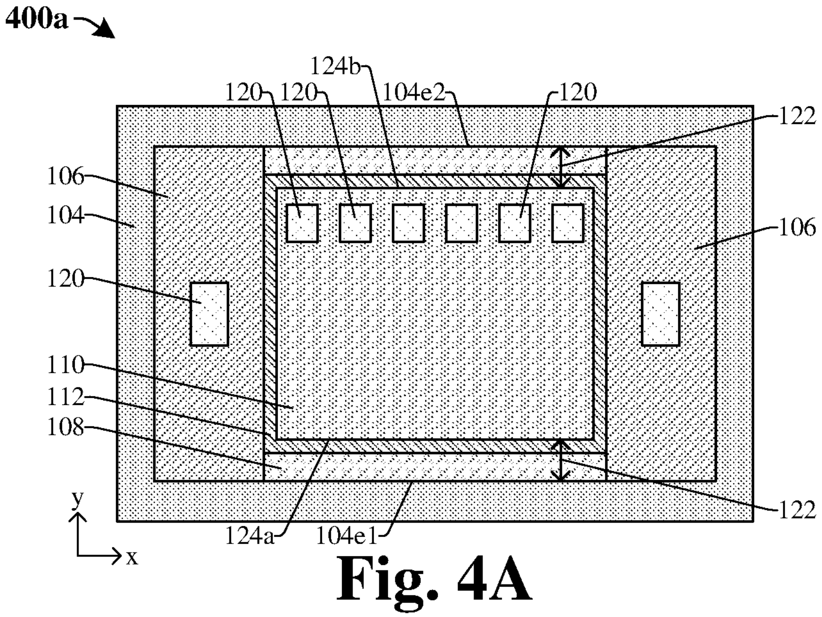
FIGS. 4A and 4B illustrate top views of some other embodiments of the integrated chip of FIGS. 1A-1C.

FIG. 4A illustrates a top view **400*a* of some other embodiments of the integrated chip of FIGS. 1A-1C, where a plurality of conductive contacts 120 overlying the gate electrode structure 110** are spaced from one another along a line extending in the first direction (e.g., along the x-axis).

Figure 4B:
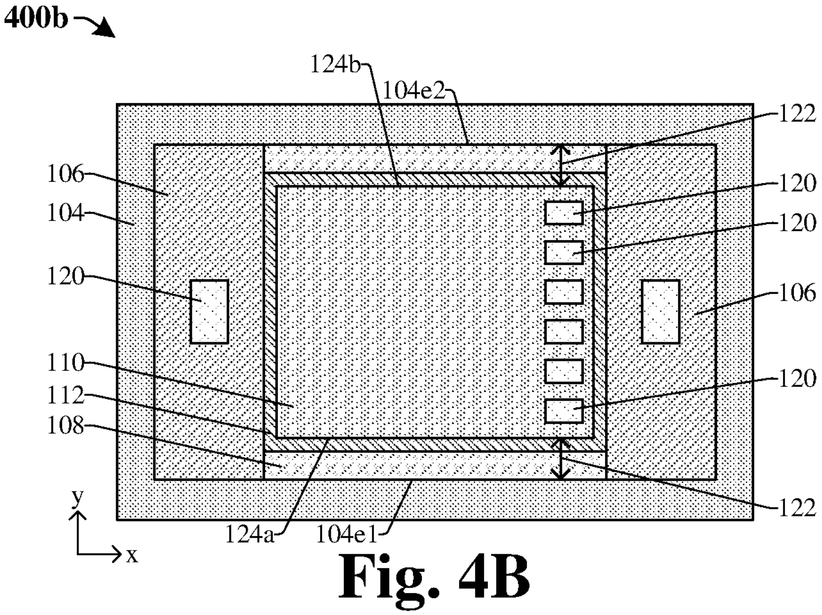

FIG. 4B illustrates a top view **400*b* of some other embodiments of the integrated chip of FIGS. 1A-1C, where a plurality of conductive contacts 120 overlying the gate electrode structure 110** are spaced from one another along a line extending in the second direction (e.g., along the y-axis).

Figure 5A:
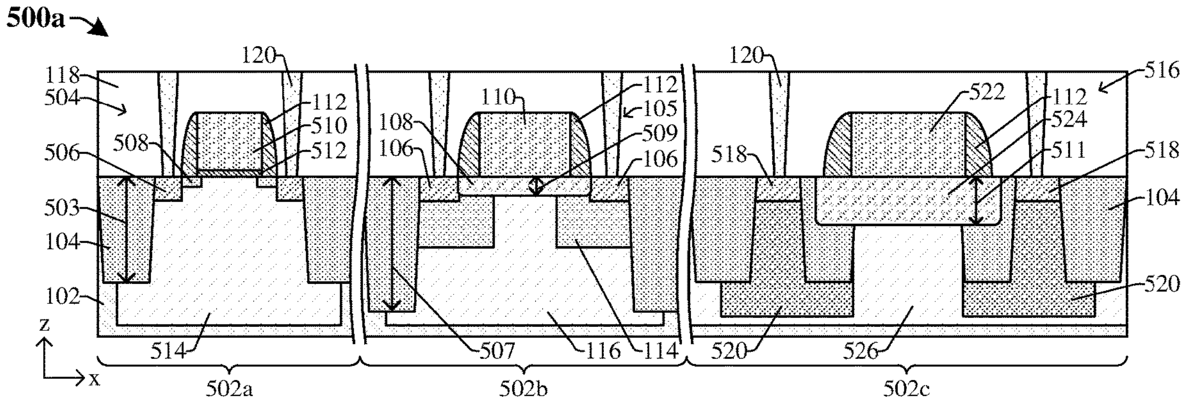
FIGS. 5A-5C illustrate various views of some embodiments of an integrated chip comprising a low voltage (LV) region, a medium voltage (MV) region, and a high voltage (HV) region.
Figure 5B:
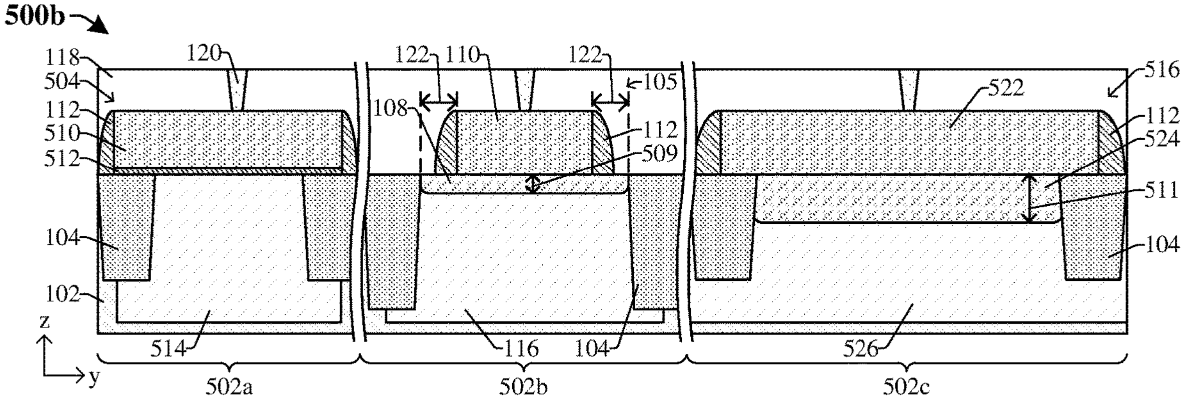
Figure 5C:
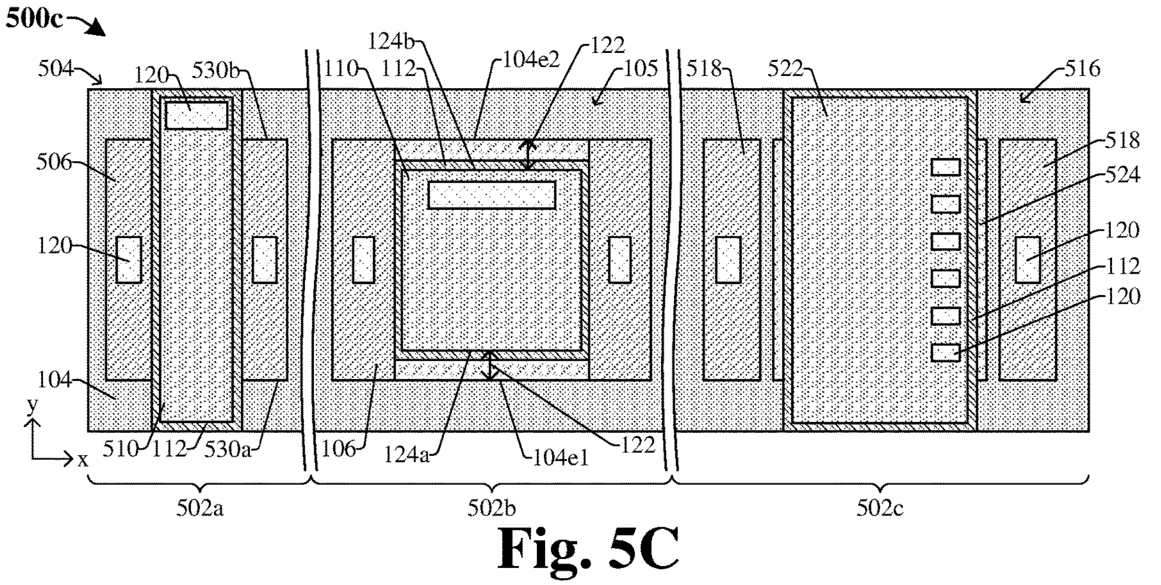

FIGS. 5A-5C illustrate various views of some embodiments of an integrated chip comprising a low voltage (LV) region **502*a*, a medium voltage (MV) region 502*b*, and a high voltage (HV) region 502*c*. FIG. 5A illustrates a cross-sectional view 500*a* of some embodiments of the integrated chip taken along a line extending along the x-axis of FIG. 5C. FIG. 5B illustrates a cross-sectional view 500*b* of some embodiments of the integrated chip taken along a line extending along the y-axis in each of the regions 502*a-c* of FIG. 5C. FIG. 5C illustrates a top view 500*c* of some embodiments of the integrated chip, where a dielectric structure 118 in FIGS. 5A and 5B is omitted from FIG. 5**C for ease of illustration.

The integrated chip comprises a LV transistor 504 disposed within the LV region **502*a*, a transistor 105 disposed within the MV region 502*b*, and a HV transistor 516 disposed within the HV region 502*c*. In some embodiments, the transistor 105 may be referred to as a MV transistor. In various embodiments, the LV transistor 504 is configured to operate at voltages within a range of about 0.7 to 1 volt (V), the transistor 105 is configured to operate at voltages within a range of about 6 to 10 V, and the HV transistor 516** is configured to operate at voltages within a range of about 25 to 32 V or greater. It will be appreciated that the foregoing voltage ranges for the transistors 504, 105, 516 in the regions 502*a-c* are merely non-limiting examples and the transistors 504, 105, 516 operating at other voltage values are within the scope of the disclosure. Further, while the regions 502*a-c* each depict a single device, it is appreciated that this is merely a non-limiting example and each of the regions 502*a-c* may have any number of devices.

In some embodiments, the LV transistor 504 comprises a LV well region 514, a LV gate dielectric layer 512, a LV gate electrode structure 510, a pair of LV lightly doped regions 508, and a pair of LV source/drain regions 506. A first portion of the STI structure 104 is disposed within the LV region 502*a* and demarcates a first device region for the LV transistor 504 in the LV region 502*a*. The LV well region 514 is disposed within the substrate 102 and comprises the first doping type (e.g., p-type). The LV gate electrode structure 510 overlies the substrate 102 and the LV gate dielectric layer 512 is spaced between the LV gate electrode structure 510 and the substrate 102. The pair of LV source/drain regions 506 are disposed in the substrate 102 on opposing sides of the LV gate electrode structure 510. The pair of LV lightly doped regions 508 abut the pair of LV source/drain regions 506. In various embodiments, the LV source/drain regions 506 and the LV lightly doped regions 508 are doped regions of the substrate 102 and comprise the second doping type (e.g., n-type). A doping concentration of the LV source/drain regions 506 is greater than a doping concentration of the LV lightly doped regions 508.

In some embodiments, a height 503 of the STI structure 104 in the LV region 502*a* is about 1,250 angstroms, within a range of about 1,150 to 1,350 angstroms, or some other suitable value. In various embodiments, a thickness of the LV gate dielectric layer 512 is about 10 angstroms, within a range of about 5 to 15 angstroms, or some other suitable value. The LV gate dielectric layer 512 may, for example, be or comprise silicon dioxide, high-k dielectric material(s) (e.g., aluminum oxide, hafnium oxide, zirconium oxide, etc.), or the like. The LV gate electrode structure 510 may, for example, be or comprise polysilicon, doped polysilicon, metal material(s) (e.g., one or more of tungsten, titanium, tantalum, aluminum, etc.), a metal nitride (e.g., titanium nitride, tantalum nitride, etc.), or the like.

The transistor 105 is disposed within the MV region 502*b*. The transistor 105 comprises a well region 116, a gate dielectric structure 108, a gate electrode structure 110, a pair of lightly doped regions 114, and a pair of source/drain regions 106. It will be appreciated that while the transistor 105 is configured as illustrated and/or described in FIGS. 1A-1C, the transistor 105 may be configured as illustrated and/or described in any one of FIG. 2A-2C, 3A-3C, 4A, or 4B. A second portion of the STI structure 104 is disposed within the MV region 502*b* and demarcates a second device region for the transistor 105 in the MV region 502*b*. The second portion of the STI structure 104 comprises a pair of isolation edges 104*e*1-2 extending in a first direction (e.g., x-axis) that at least partially define the second device region. In some embodiments, a height 507 of the STI structure 104 in the MV region 502*b* is about 2,500 angstroms, within a range of about 2,000 to 3,000 angstroms, or some other suitable value. In further embodiments, a thickness 509 of the gate dielectric structure 108 is about 200 angstroms, within a range of about 150 to 250 angstroms, or some other suitable value.

In some embodiments, the HV transistor 516 comprises a first HV well region 526, a second HV well region 520, a HV gate dielectric structure 524, a HV gate electrode structure 522, and a pair of HV source/drain regions 518. A third portion of the STI structure 104 is disposed within the HV region 502*c* and demarcates a third device region for the HV transistor 516. The first and second HV well regions 526, 520 are disposed within the substrate 102. The first HV well region 526 comprises the first doping type (e.g., p-type) and the second HV well region 520 comprises the second doping type (e.g., n-type). The HV gate dielectric structure 524 is recessed into the substrate 102. The HV gate electrode structure 522 overlies the HV gate dielectric structure 524. The pair of HV source/drain regions 518 is disposed in the substrate 102 on opposing sides of the HV gate electrode structure 522. The pair of HV source/drain regions 518 comprise the second doping type (e.g., n-type).

In some embodiments, a thickness 511 of the HV gate dielectric structure 524 is about 900 angstroms, within a range of about 800 to 1,000 angstroms, or some other suitable value. In various embodiments, the thickness 509 of the gate dielectric structure 108 is less than the thickness 511 of the HV gate dielectric structure 524. The HV gate dielectric structure 524 may, for example, be or comprise silicon dioxide, high-k dielectric material(s) (e.g., aluminum oxide, hafnium oxide, zirconium oxide, etc.), or the like. The HV gate electrode structure 522 may, for example, be or comprise polysilicon, doped polysilicon, metal material(s) (e.g., one or more of tungsten, titanium, tantalum, aluminum, etc.), a metal nitride (e.g., titanium nitride, tantalum nitride, etc.), or the like. In various embodiments, the HV gate dielectric structure 524 and the gate dielectric structure 108 comprise a first dielectric material (e.g., silicon dioxide) and the LV gate dielectric layer 512 comprises a second dielectric material (e.g., a high-k dielectric material) different from the first dielectric material. In some embodiments, the LV gate electrode structure 510, the gate electrode structure 110, and the HV gate electrode structure 522 comprise a same conductive material (e.g., tungsten, titanium, tantalum, aluminum, titanium nitride, tantalum nitride, etc.). A sidewall spacer structure 112 is disposed around sidewalls of the LV gate electrode structure 510, the gate electrode structure 110, and the HV gate electrode structure 522. The sidewall spacer structure 112 may, for example, be or comprise silicon dioxide, silicon nitride, or the like. In various embodiments, the LV transistor 504, the transistor 105, and the HV transistor 516 are each configured as a planar transistor such as a MOSFET.

With reference to FIGS. 5B and 5C, the LV gate electrode structure 510 directly overlies a first pair of isolation edges 530*a-b* of the STI structure 104 in the LV region 502*a*. The HV gate electrode structure 522 directly overlies a second pair of isolation edges 532*a-b* of the STI structure 104 in the HV region 502*c*. Further, the gate electrode structure 110 is spaced between the pair of isolation edges 104*e*1-2 of the STI structure 104 in the MV region 502*b* by the distance 122. Spacing the gate electrode structure 110 from the pair of isolation edges 104*e*1-2 reduces the noise in the transistor 105, mitigates negative effects from a reduced GOI of the gate dielectric structure 108 near the isolation edges 104*e*1-2, and mitigates the presence of one or more hump(s) in the gate electrode structure 110. Further, the spacing facilitates decreasing a lateral footprint of the transistor 105, thereby decreasing an overall size of the MV region 502*b* over the substrate 102. This increases space for other devices disposed over the substrate 102, thereby increasing device density of the integrated chip.

Figure 6A:
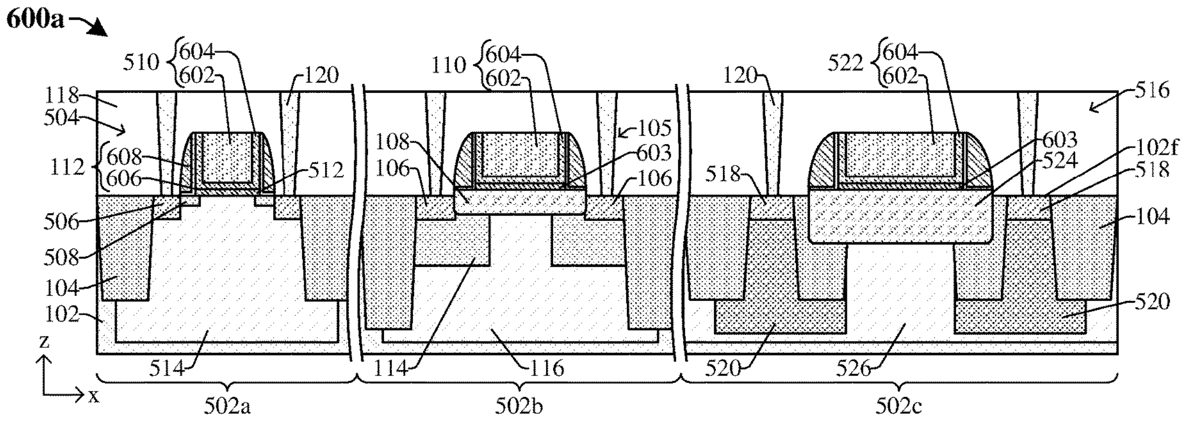
FIGS. 6A and 6B illustrate cross-sectional views of some other embodiments of the integrated chip of FIGS. 5A-5C.
Figure 6B:
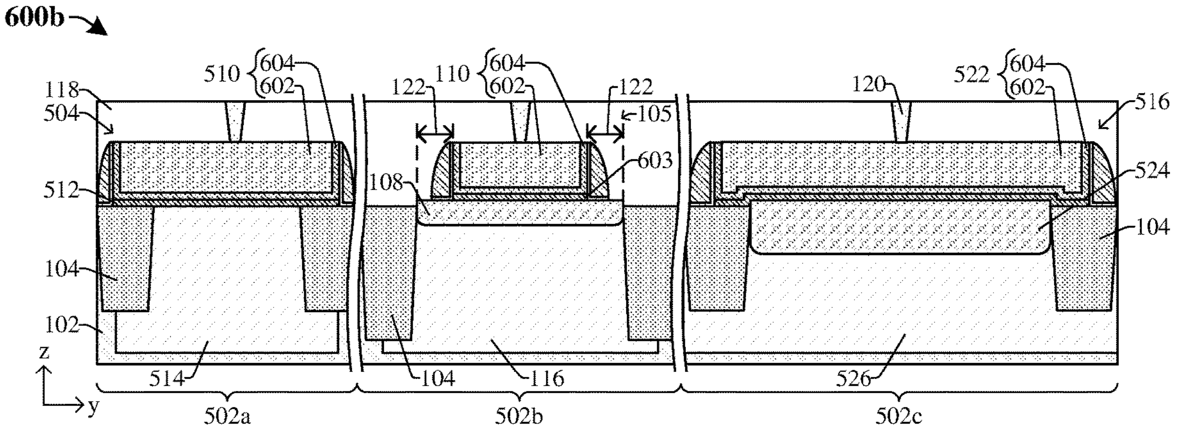

FIGS. 6A and 6B illustrate cross-sectional views 600*a* and 600*b* corresponding to some other embodiments of the integrated chip of FIGS. 5A-5C. The cross-sectional view

600*a* of FIG. 6A corresponds to another embodiment of the cross-sectional view 500*a* of FIG. 5A and the cross-sectional view 600*b* of FIG. 6B corresponds to another embodiment of the cross-sectional view 500*b* of FIG. 5B.

In some embodiments, top surfaces of the gate dielectric structure 108 and the HV gate dielectric structure 524 are vertically offset from the front-side surface 102*f* of the substrate 102. An upper gate dielectric layer 603 is disposed along the top surfaces of the gate dielectric structure 108 and the HV gate dielectric structure 524. In some embodiments, the upper gate dielectric layer 603 comprises silicon dioxide, a high-k dielectric material, or the like. In some embodiments, the sidewall spacer structure 112 comprises a first sidewall spacer layer 606 comprising a first material (e.g., silicon nitride) and a second sidewall spacer layer 608 comprising a second material (e.g., silicon dioxide) different from the first material. In various embodiments, when viewed in cross-section the first sidewall spacer layer 606 has a L-shape. In some embodiments, the LV gate electrode structure 510, the gate electrode structure 110, and the HV gate electrode structure 522 respectively comprise a first gate electrode layer 604 and a second gate electrode layer 602. In some embodiments, the first gate electrode layer 604 comprises a high-k dielectric material (e.g., hafnium oxide) and the second gate electrode layer 602 comprises a conductive material (e.g., tungsten, titanium, tantalum, aluminum, titanium nitride, tantalum nitride, some other conductive material, or any combination of the foregoing). In various embodiments, the first gate electrode layer 604 is U-shaped and extends along a bottom surface and opposing sidewalls of the second gate electrode layer 602. In various embodiments, the upper gate dielectric layer 603 is omitted (not shown).

Figure 7:
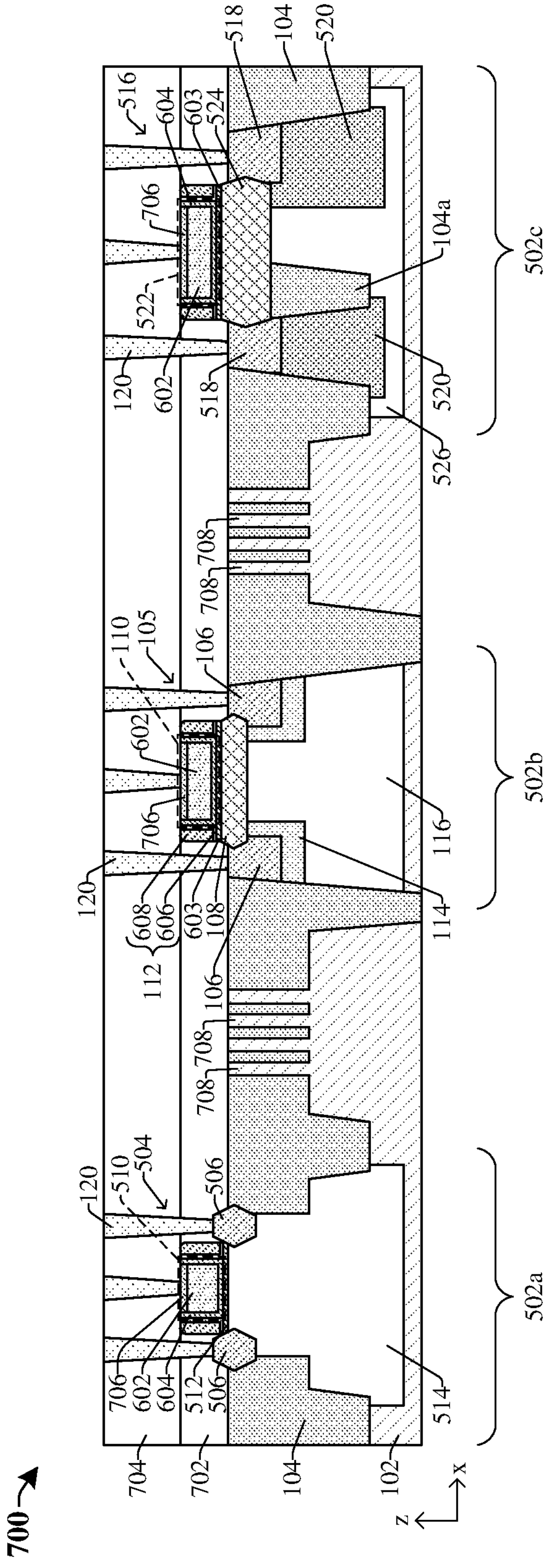
FIG. 7 illustrates a cross-sectional view of some other embodiments of the integrated chip of FIGS. 6A and 6B.

FIG. 7 illustrates a cross-sectional view 700 corresponding to some other embodiments of the integrated chip of FIG. 6A.

In various embodiments, the LV transistor 504 is configured as a fin field-effect transistor (FinFET) or a gate-all-around FET (GAAFET) and the transistor 105 and the HV transistor 516 are each configured as a planar MOSFET. In such embodiments, the pair of LV source/drain regions 506 are doped epitaxial silicon structures disposed on opposing sides of the LV gate electrode structure 510. In some embodiments, the LV gate electrode structure 510 overlies a fin structure extending from a lower region of the substrate 102. Further, the substrate 102 comprises a plurality of dummy fin structures 708 spaced laterally between the LV region 502*a* and the MV region 502*b* and spaced laterally between the MV region 502*b* and the HV region 502*c*. In some embodiments, the LV gate electrode structure 510, the gate electrode structure 110, and the HV gate electrode structure 522 respectively comprise a gate electrode capping layer 706 that overlies the second gate electrode layer 602. The gate electrode capping layer 706 may, for example, be or comprise a conductive material such as a metal material, silicide, or the like. In various embodiments, the STI structure 104 comprises an isolation segment 104*a* directly underlying the HV gate dielectric structure 524 disposed laterally between the pair of HV source/drain regions 524. A first dielectric layer 702 overlies the substrate 102 and a second dielectric layer 704 overlies the first dielectric layer 702. The plurality of conductive contacts 120 are disposed within the first and second dielectric layers 702, 704. The first and second dielectric layers 702, 704 may, for example, be or comprise silicon dioxide, a low-k dielectric material, or some other suitable material. As used herein, a low-k dielectric material is a dielectric material with a dielectric constant less than 3.9.

FIGS. 8A through 20 illustrate various views 800*a*-2000 of some embodiments of a method of forming a transistor having a gate electrode structure spaced between isolation edges of an STI structure. Although the various views 800*a*-2000 shown in FIGS. 8A through 20 are described with reference to a method, it will be appreciated that the structures shown in FIGS. 8A through 20 are not limited to the method but rather may stand alone separate of the method. Although FIGS. 8A through 20 are described as a series of acts, it will be appreciated that these acts are not limiting in that the order of the acts can be altered in other embodiments, and the methods disclosed are also applicable to other structures. In other embodiments, some acts that are illustrated and/or described may be omitted in whole or in part.

Figure 8A:
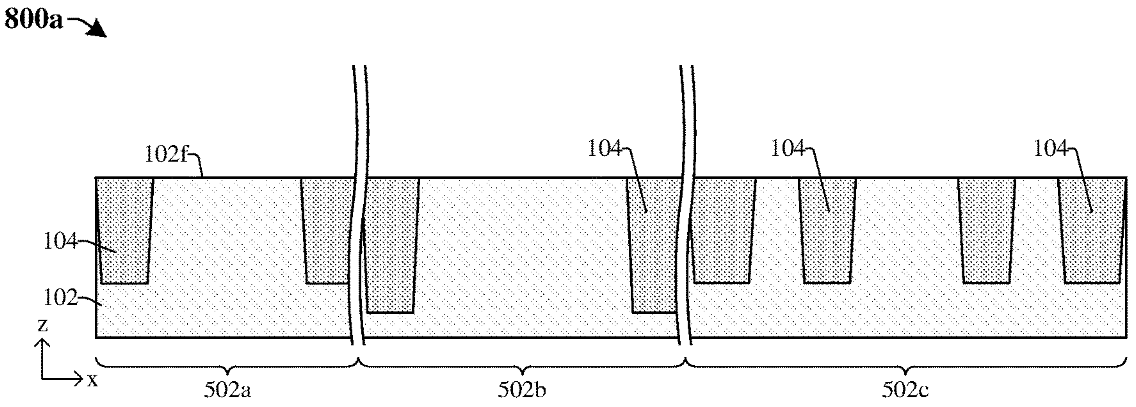
FIGS. 8A through 20 illustrate various views of some embodiments of a method of forming a transistor having a gate electrode structure spaced between isolation edges of an STI structure.
Figure 8B:
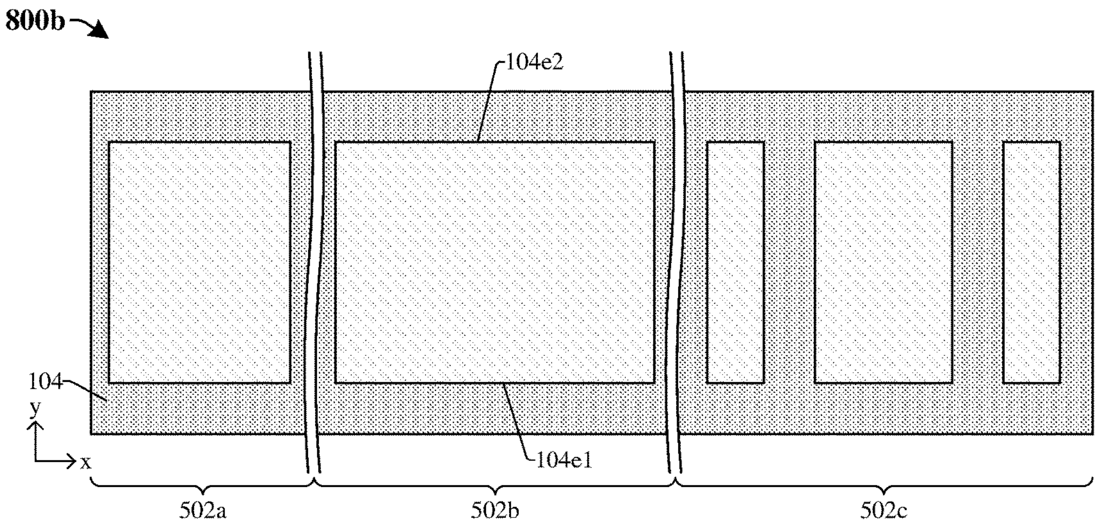

As shown in cross-sectional view 800*a* of FIG. 8A and top view 800*b* of FIG. 8B, an STI structure 104 is formed within a substrate 102. The substrate 102 may, for example, be or comprise silicon, germanium, silicon germanium, epitaxial silicon, a silicon-on-insulator (SOI), some other semiconductor material, or the like. In some embodiments, forming the STI structure 104 includes: forming a masking layer (not shown) over the substrate 102; etching (e.g., by a plasma etch, a reactive-ion etch, etc.) the substrate 102 to form one or more isolation trenches extending into a front-side surface 102*f* of the substrate 102; depositing (e.g., by chemical vapor deposition (CVD), physical vapor deposition (PVD), atomic layer deposition (ALD), etc.) a dielectric material (e.g., silicon dioxide, silicon nitride, silicon oxynitride, or the like) within the one or more isolation trenches; and performing a removal process to remove the masking layer. The substrate 102 comprises a LV region 502*a*, a MV region 502*b*, and a HV region 502*c*. The STI structure 104 demarcates one or more device regions in the LV, MV, and HV regions 502*a-c*.

FIG. 8A illustrates the cross-sectional view 800*a* taken along a line extending along the x-axis of the top view 800*b* of FIG. 8B. As seen in the top view 800*b* of FIG. 8B, the STI structure 104 comprises a pair of isolation edges 104*e*1-2 elongated in a first direction (e.g., along the x-axis). The pair of isolation edges 104*e*1-2 at least partially define a device region in the MV region 502*b*.

Figure 9:
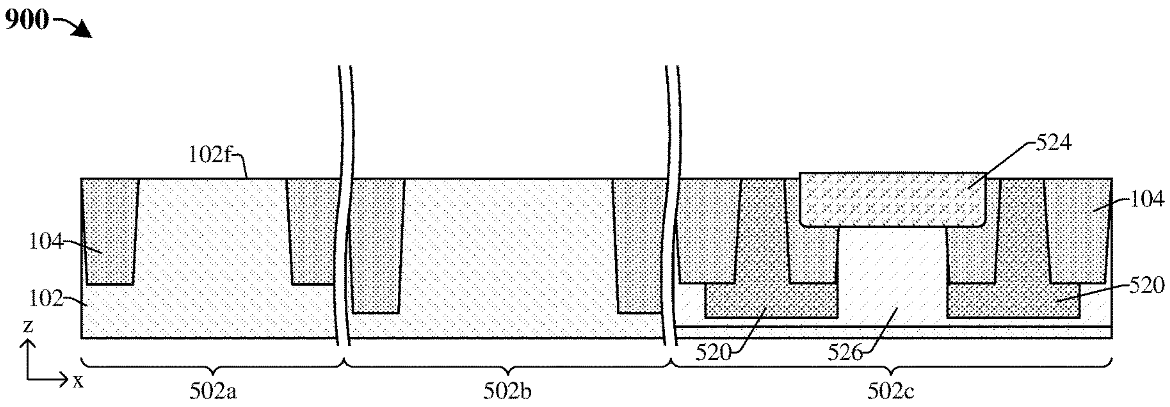

As shown in cross-sectional view 900 of FIG. 9, a first HV well region 526, a second HV well region 520, and a HV gate dielectric structure 524 are formed within the HV region 502*c*. The first HV well region 526 is, for example, formed by a first ion implantation process and comprises a first doping type (e.g., p-type). The second HV well region 520 is, for example, formed by a second ion implantation process and comprises a second doping type (e.g., n-type) opposite the first doping type. In some embodiments, the first HV well region 526 is formed before the second HV well region 520. In various embodiments, forming the HV gate dielectric structure 524 includes: forming a masking layer (not shown) over the substrate 102; etching (e.g., by a plasma etch, a reactive-ion etch, etc.) the substrate 102 and a portion of the STI structure 104 in the HV region 502*c* to form an opening extending into a front-side surface 102*f* of the substrate; depositing (e.g., by CVD, PVD, ALD, thermal oxidation, etc.) a gate dielectric material (e.g., silicon dioxide, a high-k dielectric material, etc.) within the opening; and performing a removal process to remove the masking layer. In some embodiments, the HV gate dielectric structure 524 is formed by a local oxidation of silicon (LOCOS)

process. In further embodiments, the HV gate dielectric structure 524 is formed after the first and second HV well regions 526, 520 are formed.

Figure 10:
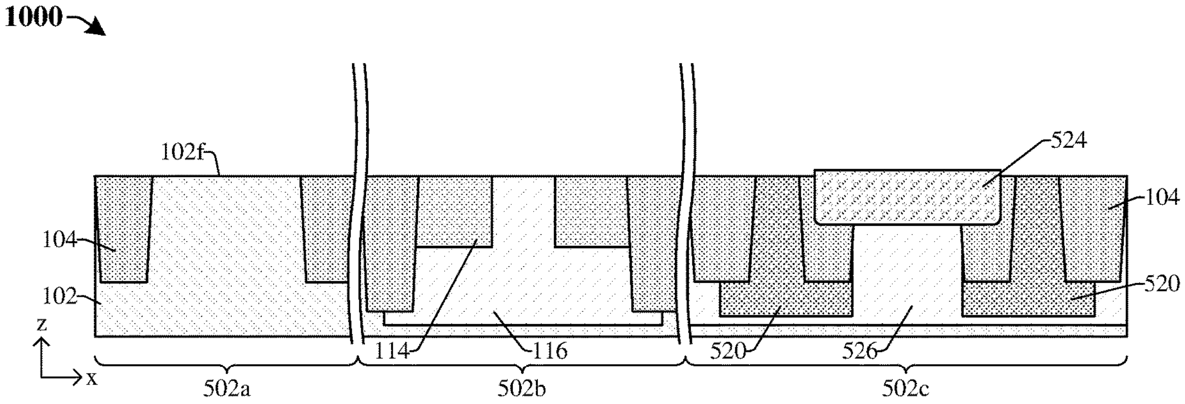

As shown in cross-sectional view 1000 of FIG. 10, a well region 116 and a pair of lightly doped regions 114 are formed within the MV region 502*b*. The well region 116 is, for example, formed by a first ion implantation process and comprises the first doping type (e.g., p-type). The pair of lightly doped regions 114 is, for example, formed by a second ion implantation process and comprises the second doping type (e.g., n-type).

Figure 11:
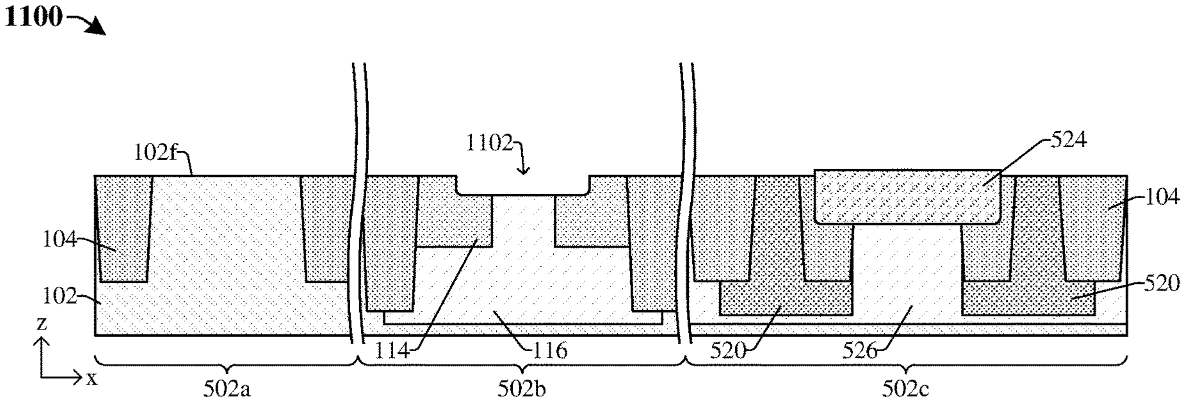

As shown in cross-sectional view 1100 of FIG. 11, patterning process is performed on the front-side surface 102*f* of the substrate to form an opening 1102 in the MV region 502*b*. In some embodiments, the patterning process includes: forming a masking layer (not shown) over the substrate 102; etching (e.g., by a plasma etch, a reactive-ion etch, etc.) the substrate 102 to form the opening; and performing a removal process to remove the masking layer.

Figure 12:
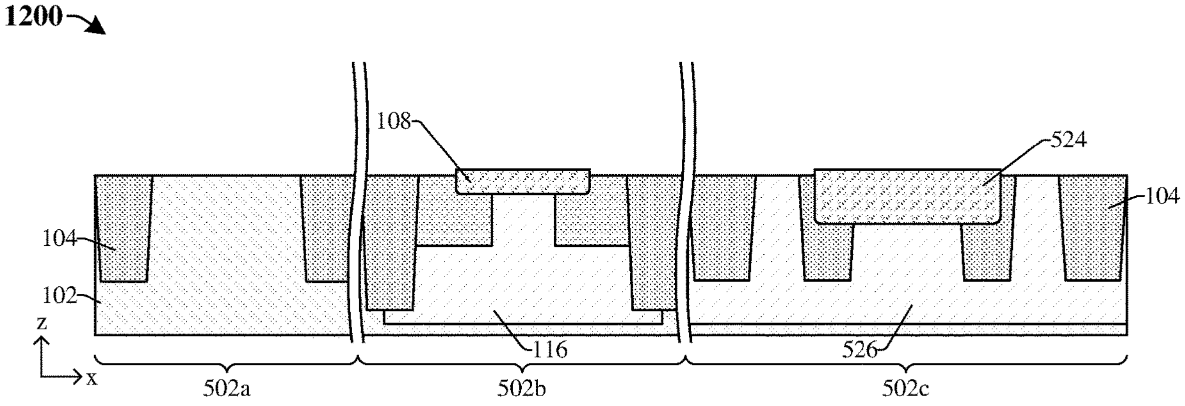

As shown in cross-sectional view 1200 of FIG. 12, a gate dielectric structure 108 is formed within the MV region 502*b*. In some embodiments, the gate dielectric structure 108 is formed within the opening (1102 of FIG. 11) by a CVD process, a PVD process, an ALD process, a thermal oxidation process, or some other suitable growth or deposition process. In various embodiments, the gate dielectric structure 108 is formed by a LOCOS process.

Figure 13:
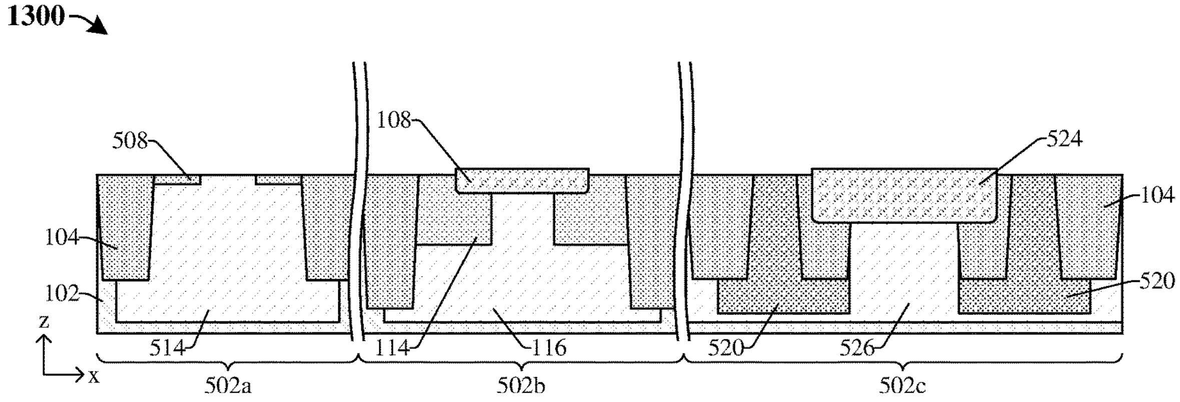

A shown in cross-sectional view 1300 of FIG. 13, a LV well region 514 and a pair of LV lightly doped regions 508 are formed with the LV region 502*a*. The LV well region 514 is, for example, formed by a first ion implantation process and comprises the first doping type (e.g., p-type). The pair of LV lightly doped regions 508 is, for example, formed by a second ion implantation process and comprises the second doping type (e.g., n-type).

Figure 14A:
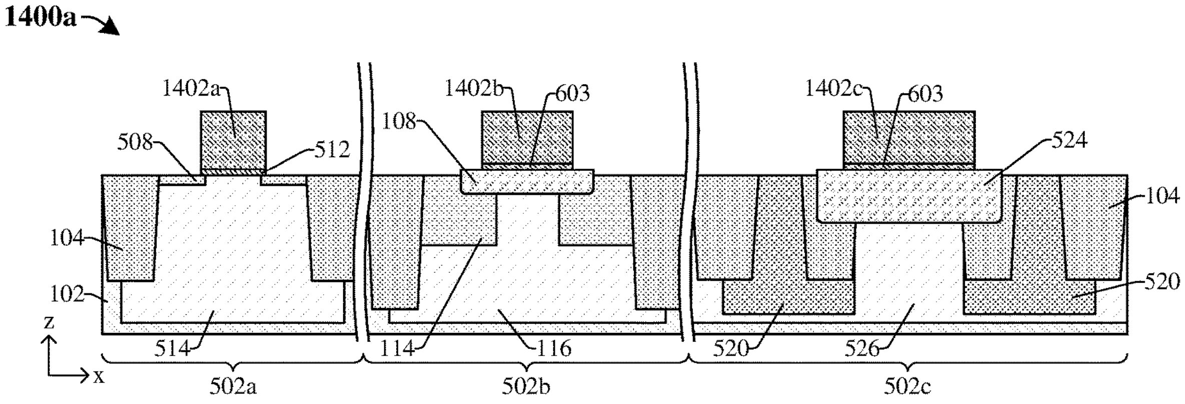
Figure 14B:
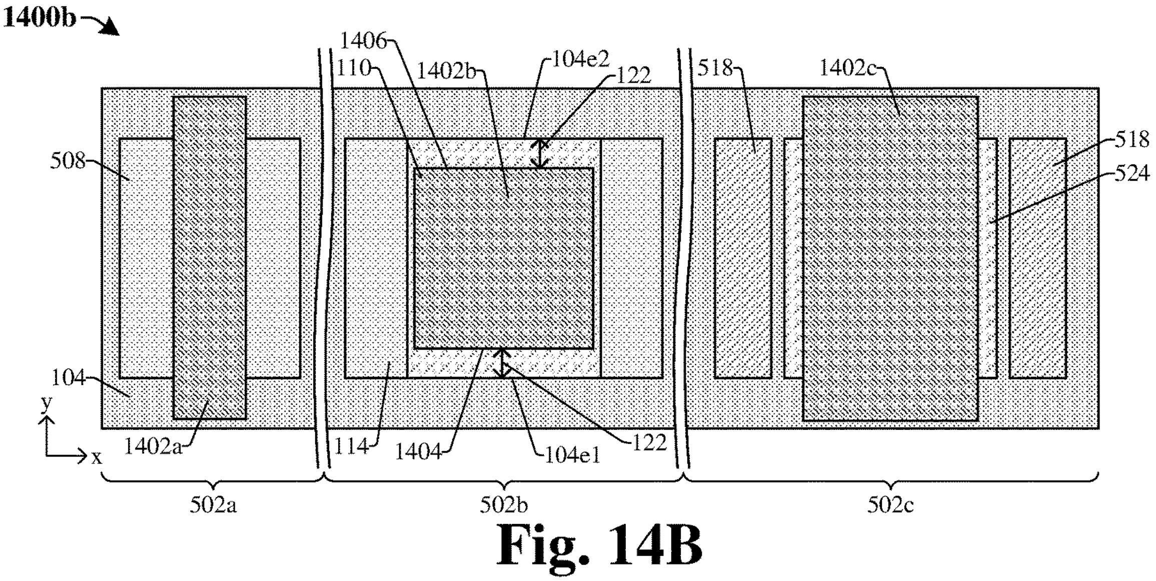

A shown in cross-sectional view 1400*a* of FIG. 14A and top view 1400*b* of FIG. 14B, a LV gate dielectric layer 512, upper gate dielectric layers 603, and a plurality of sacrificial gate electrode structures 1402*a-c* are formed over the substrate 102. In some embodiments, the plurality of sacrificial gate electrode structures 1402*a-c* includes a first sacrificial gate electrode structure 1402*a* over the LV gate dielectric layer 512 in the LV region 502*a*, a second sacrificial gate electrode structure 1402*b* over an upper gate dielectric layer 603 in the MV region 502*b*, and a third sacrificial gate electrode structure 1402*c* over an upper gate dielectric layer 603 in the HV region 502*c*. In some embodiments, a process for forming the LV gate dielectric layer 512, upper gate dielectric layers 603, and plurality of sacrificial gate electrode structures 1402*a-c* includes: depositing (e.g., by CVD, PVD, ALD, etc.) a gate dielectric film (e.g., comprising silicon dioxide, a high-k dielectric material, or the like) over the substrate 102; depositing a sacrificial gate electrode layer (e.g., comprising polysilicon or some other suitable material) over the gate dielectric film; and performing one or more patterning process(es) on the gate dielectric film and the sacrificial gate electrode layer. In various embodiments, an individual patterning process may be performed on each of the LV, MV, and HV regions 502*a*, 502*b*, 502*c*. For example, a first patterning process may be performed on the LV region 502*a* to form the LV gate dielectric layer 512 and the first sacrificial gate electrode structure 1402*a*, a second patterning process may be performed on the MV region 502*b* to form the upper gate dielectric layer 603 and the second sacrificial gate electrode structure 1402*b*, and so on. In yet further embodiments, the plurality of sacrificial gate electrode structures 1402*a-c* may be formed concurrently by a single patterning process.

FIG. 14A illustrates the cross-sectional view 1400*a* taken along a line extending along the x-axis of the top view 1400*b* of FIG. 14B. As seen in the top view 1400*b* of FIG. 14B, the second sacrificial gate electrode structure 1402*b* comprises a first pair of opposing sidewalls 1404, 1406 elongated in a first direction (e.g., along the x-axis). The opposing sidewalls 1404, 1406 of the second sacrificial gate electrode structure 1402*b* are each spaced from a corresponding one of the isolation edges 104*e*1-2 by a distance 122. In various embodiments, the distance 122 is, for example, within a range of about 0.01 to 0.1 um or some other suitable value. In some embodiments, a length (e.g., defined along the y-axis) of the second sacrificial gate electrode structure 1402*b* is less than a lateral distance between the isolation edges 104*e*1-2.

Figure 15:
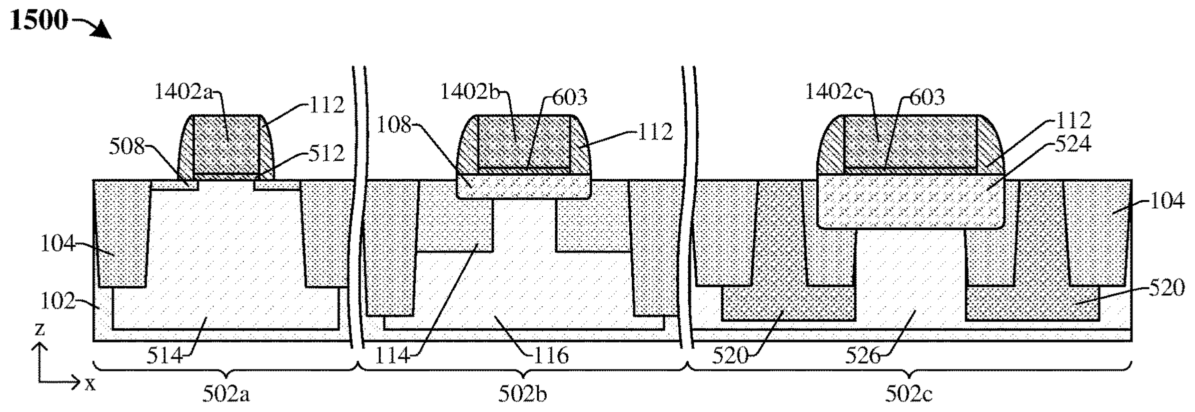

As shown in cross-sectional view 1500 of FIG. 15, a sidewall spacer structure 112 is formed around perimeters of the sacrificial gate electrode structures 1402*a-c*. In some embodiments, a process for forming the sidewall spacer structure 112 includes depositing (e.g., by CVD, PVD, ALD, etc.) one or more sidewall spacer layer(s) over the substrate 102 and along sidewalls of the sacrificial gate electrode structures 1402*a-c* and performing an etching process (e.g., a plasma etch, a reactive-ion etch, etc.) to remove the one or more sidewall spacer layer(s) from lateral surfaces.

Figure 16:
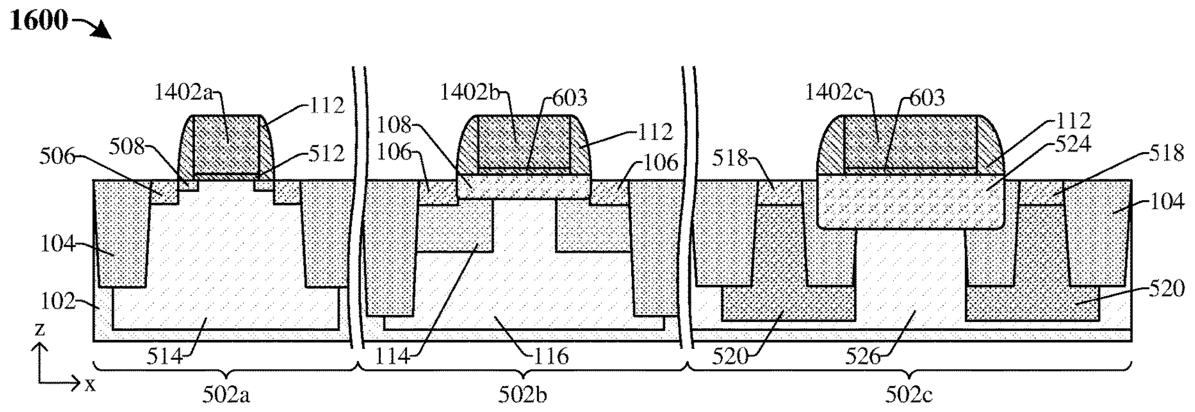

As shown in cross-sectional view 1600 of FIG. 16, a pair of LV source/drain regions 506 is formed in the LV region 502*a*, a pair of source/drain regions 106 is formed in the MV region 502*b*, and a pair of HV source/drain regions 518 is formed within the HV region 502*c*. In some embodiments, the LV source/drain regions 506, the source/drain regions 106, and the HV source/drain regions 518 are formed by one or more ion implantation process(es). In some embodiments, an individual ion implantation process may be performed on each of the LV, MV, and HV regions to form the source/drain regions 506, 106, 518. For example, a first ion implantation process is performed on the LV region 502*a* to form the pair of LV source/drain regions 506, a second ion implantation process is performed on the MV region 502*b* to from the pair of source/drain regions 106, and so on. In further embodiments, the pair of LV source/drain regions 506 may be formed by an epitaxial growth process.

Figure 17:
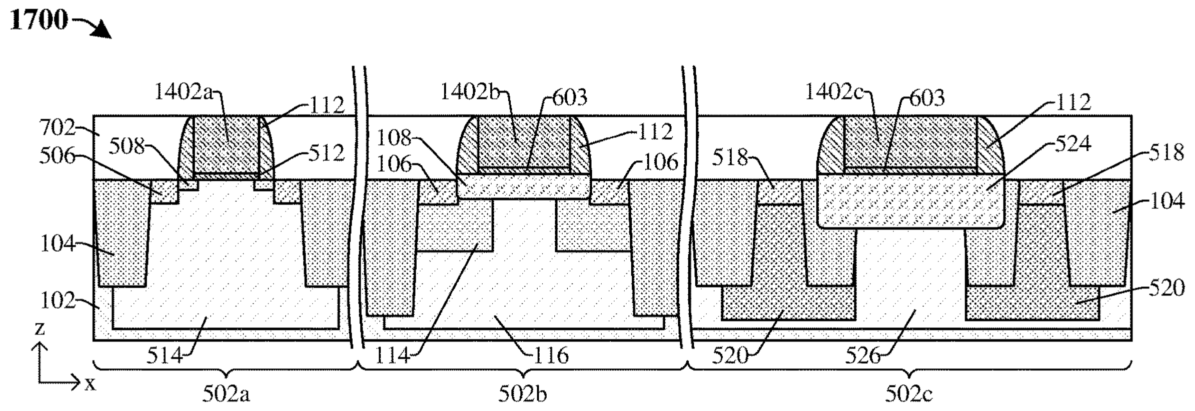

A shown in cross-sectional view 1700 of FIG. 17, a first dielectric layer 702 is formed over the substrate 102. In some embodiments, forming the first dielectric layer 702 includes depositing (e.g., by CVD, PVD, ALD, etc.) a dielectric material (e.g., silicon dioxide, a low-k dielectric material, etc.) over the substrate 102 and performing a planarization process (e.g., a chemical mechanical planarization (CMP) process) into the first dielectric layer 702.

Figure 18A:
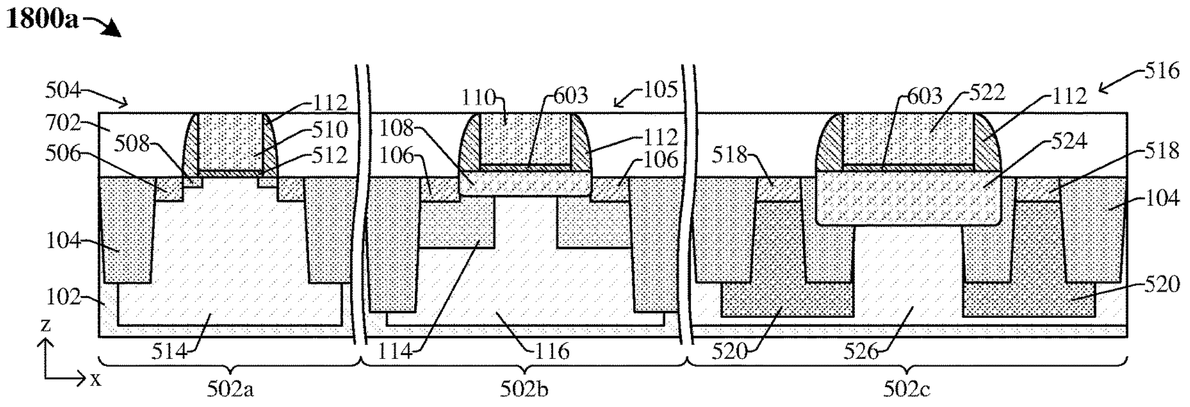
Figure 18B:
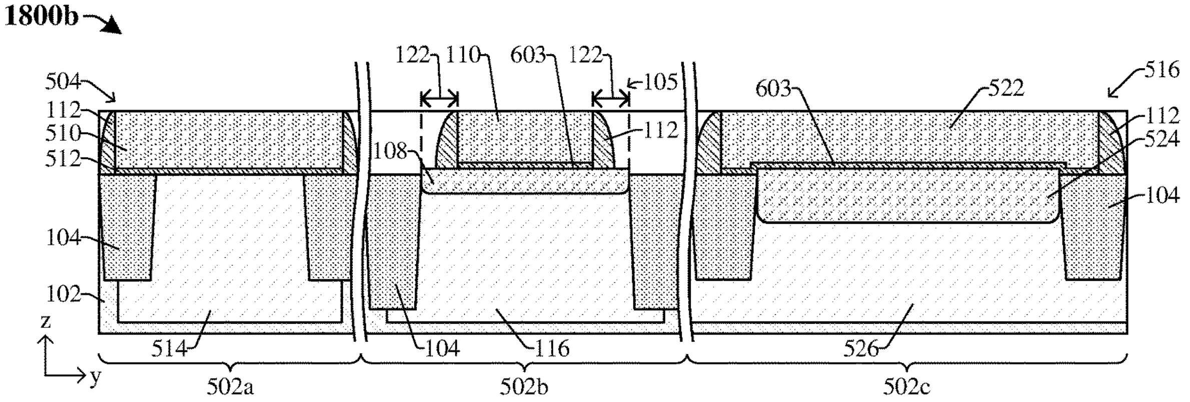
Figure 18C:
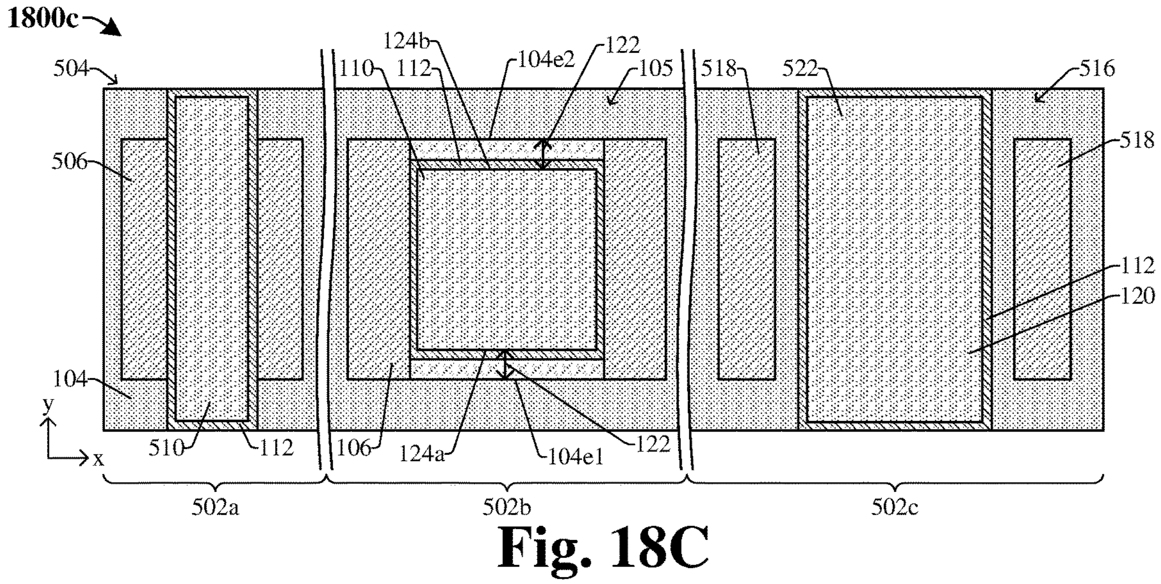

As shown in cross-sectional views 1800*a* and 1800*b* of FIGS. 18A and 18B and top view 1800*c* of FIG. 18C, a LV gate electrode structure 510, a gate electrode structure 110, and a HV gate electrode structure 522 are formed within the LV region 502*a*, the MV region 502*b*, and the HV region 502*c*, respectively, thereby defining a LV transistor 504, a transistor 105, and a HV transistor 516. FIG. 18A illustrates the cross-sectional view 1800*a* taken along a line extending along the x-axis of the top view 1800*c* of FIG. 18C. FIG. 18B illustrates the cross-sectional view 1800*b* taken along a line extending along the y-axis in each of the regions 502*a-c* of the top view 1800*c* of FIG. 18C.

In some embodiments, the LV gate electrode structure 510, the gate electrode structure 110, and the HV gate electrode structure 522 are formed by one or more replacement process(es). In various embodiments, the replacement process includes: removing one or more of the sacrificial gate electrode structures (1402*a-c* of FIG. 17) to form gate opening(s) over the substrate 102; depositing (e.g., by CVD, PVD, ALD, sputtering, electroplating, electroless plating, etc.) one or more gate electrode layer(s) within the gate opening(s); and performing a planarization process (e.g., a CMP process) on the one or more gate electrode layer(s). The one or more gate electrode layer(s) comprise at least one conductive layer (e.g., comprising tungsten, titanium, tantalum, aluminum, titanium nitride, tantalum nitride, etc.). In some embodiments, the one or more gate electrode layer(s) further comprises a gate dielectric layer (e.g., comprising a high-k dielectric material or the like) extending along sidewalls and a lower surface of the at least one conductive layer (e.g., as illustrated and/or described in FIGS. 6A and 6B).

In various embodiments, an individual replacement process may be performed on each of the LV, MV, and HV regions 502*a*, 502*b*, 502*c*. For example, in such embodiments, a first replacement process may be performed on the LV region 502*a* to form the LV gate electrode structure 510, a second replacement process may be performed on the MV region 502*b* to form the gate electrode structure 110, and so on. In yet further embodiments, the LV gate electrode structure 510, the gate electrode structure 110, and the HV gate electrode structure 522 are formed concurrently by a single replacement process. In such embodiments, the single replacement process includes: removing the sacrificial gate electrode structures (1402*a-c* of FIG. 17) to form gate openings over the substrate 102; depositing (e.g., by CVD, PVD, ALD, sputtering, electroplating, electroless plating, etc.) one or more gate electrode layer(s) within the gate openings; and performing a planarization process (e.g., a CMP process) on the one or more gate electrode layer(s).

As seen in the cross-sectional view 1800*b* of FIG. 18B and the top view 1800*c* of FIG. 18C, the gate electrode structure 110 comprises a first pair of opposing sidewalls 124*a-b* elongated in the first direction (e.g., along the x-axis) and spaced between the isolation edges 104*e*1-2 by the distance 122. Spacing the gate electrode structure 110 from the pair of isolation edges 104*e*1-2 reduces noise, mitigates negative effects from a reduced GOI of the gate dielectric structure 108 near the isolation edges 104*e*1-2, and mitigates the presence of one or more hump(s) in the gate electrode structure 110. Further, the spacing facilitates decreasing a lateral footprint of the gate electrode structure 110, thereby decreasing an overall size of the MV region 502*b* over the substrate 102.

Figure 19:
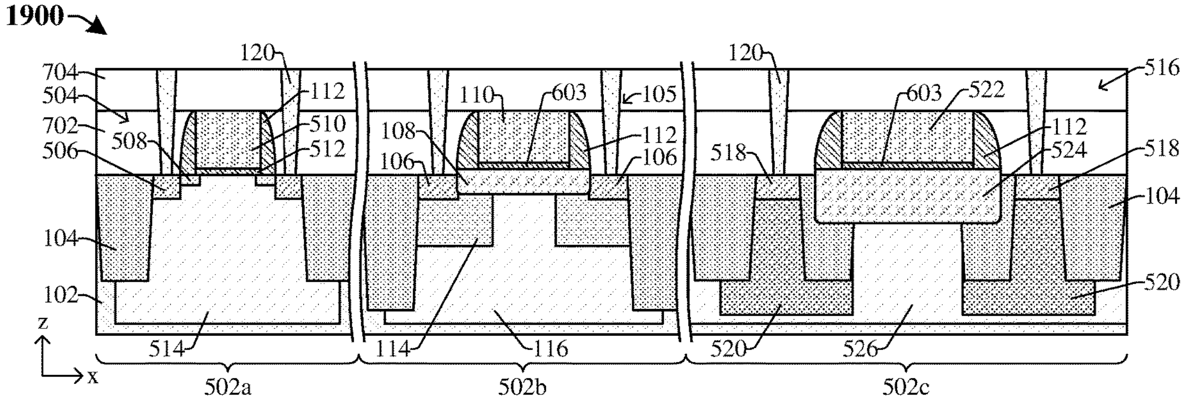

As shown in cross-sectional view 1900 of FIG. 19, a second dielectric layer 704 is formed over the first dielectric layer 702 and a plurality of conductive contacts 120 are formed over the substrate 102. The second dielectric layer 704 may be formed over the substrate 102 by, for example, a CVD process, a PVD process, and ALD process, or some other suitable growth or deposition process. In some embodiments, a process for forming the plurality of conductive contacts 120 includes: etching the first and second dielectric layers 702, 704 to form contact openings in the first and second dielectric layers 702, 704; depositing (e.g., by CVD, PVD, sputtering, electroless plating, etc.) a conductive material within the contact openings; and performing a planarization process (e.g., a CMP process) on the conductive material.

Figure 20:
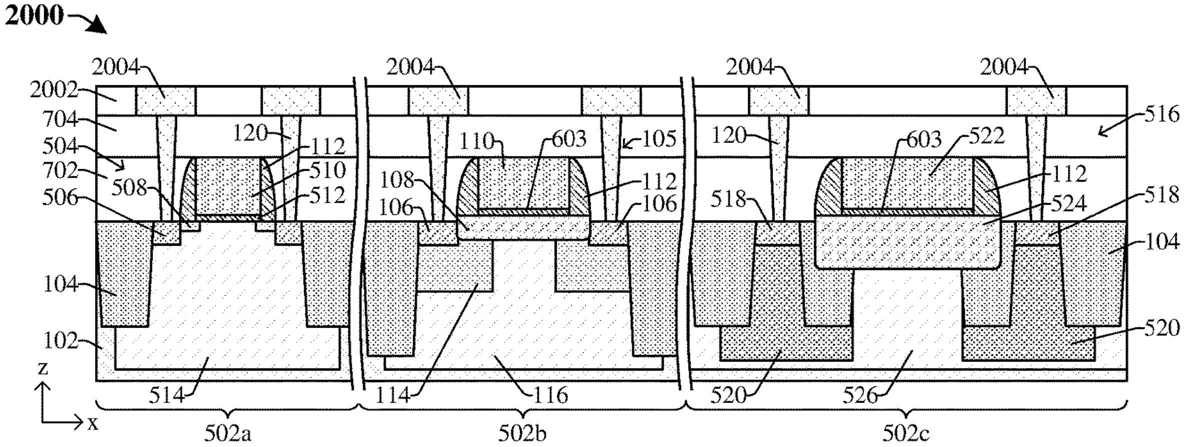

As shown in cross-sectional view 2000 of FIG. 20, a third dielectric layer 2002 is formed over the second dielectric layer 704 and a plurality of conductive wires 2004 are formed over the conductive contacts 120. The third dielectric layer 2002 may be formed over the second dielectric layer 704 by, for example, a CVD process, a PVD process, an ALD process, or some other suitable growth or deposition process. In various embodiments, a process for forming the plurality of conductive wires includes: etching the third dielectric layer 2002 to form a plurality of openings in the third dielectric layer 2002; depositing (e.g., by CVD, PVD, sputtering, electroless plating, etc.) a conductive material within the openings; and performing a planarization process (e.g., a CMP process) on the conductive material.

Figure 21:
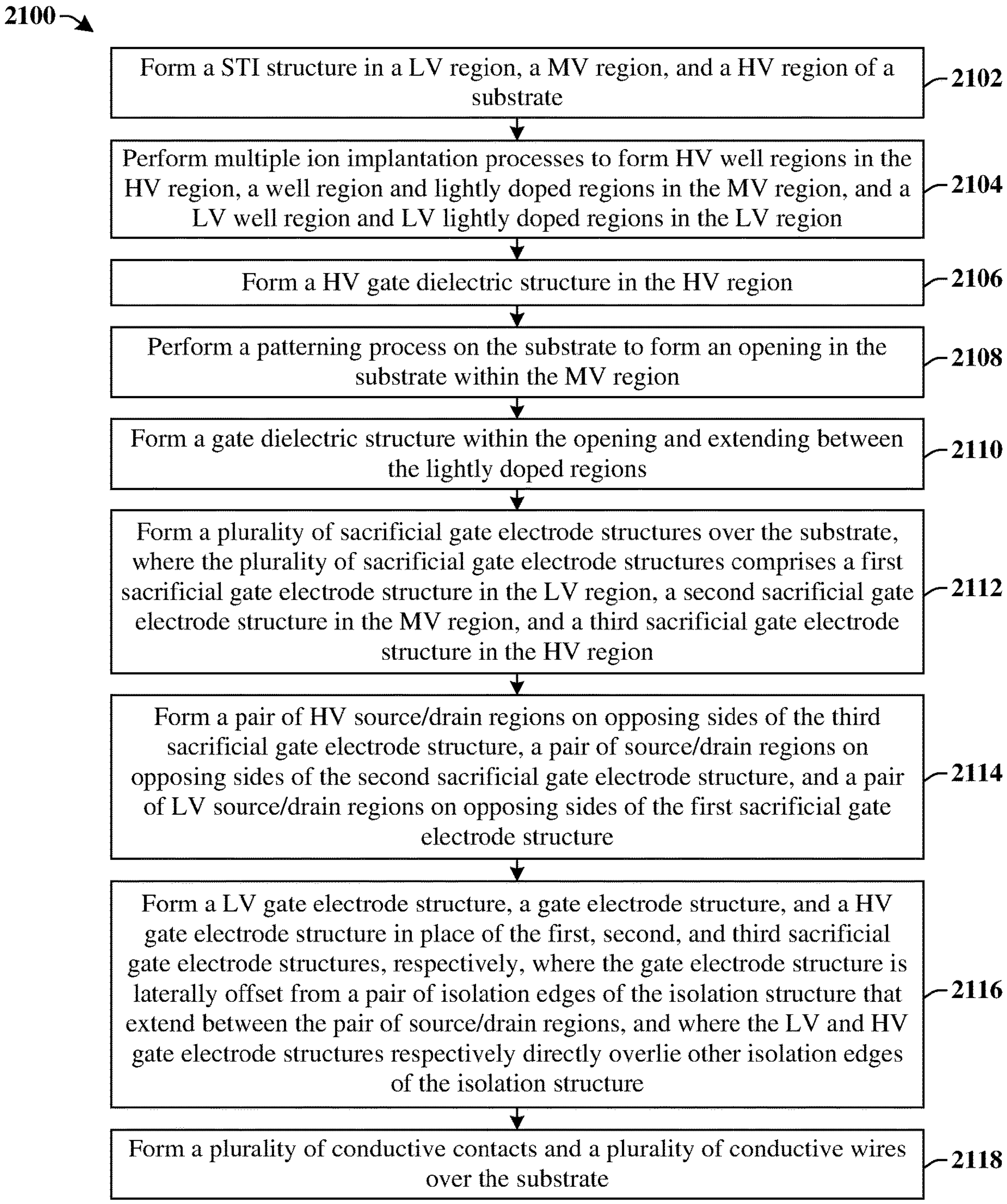
FIG. 21 illustrates a method in flowchart format that illustrates some embodiments of a method of forming a transistor having a gate electrode structure spaced between isolation edges of an STI structure.

FIG. 21 illustrates a method 2100 of some embodiments of a method of forming a transistor having a gate electrode structure spaced between isolation edges of an STI structure according to the present disclosure. Although the method 2100 is illustrated and/or described as a series of acts or events, it will be appreciated that the method is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included.

At act 2102, an STI structure is formed within a LV region, a MV region, and a HV region of a substrate. FIGS. 8A and 8B illustrate a cross-sectional view 800*a* and top view 800*b* corresponding to some embodiments of act 2102.

At act 2104, multiple ion implantation processes are performed to form HV well regions in the HV region, a well region and lightly doped regions in the MV region, and a LV well region and LV lightly doped regions in the LV region. FIGS. 9-13 illustrate cross-sectional views 900-1300 corresponding to some embodiments of act 2104.

At act 2106, a HV gate dielectric structure is formed in the HV region. FIG. 9 illustrates a cross-sectional view 900 corresponding to some embodiments of act 2106.

At act 2108, a patterning process is performed on the substrate to form an opening in the substrate within the MV region. FIG. 11 illustrates a cross-sectional view 1100 corresponding to some embodiments of act 2108.

At act 2110, a gate dielectric structure is formed within the opening and extending between the lightly doped regions. FIG. 12 illustrates a cross-sectional view 1200 corresponding to some embodiments of act 2110.

At act 2112, a plurality of sacrificial gate electrode structures are formed over the substrate. The plurality of sacrificial gate electrode structures comprises a first sacrificial gate electrode structure in the LV region, a second sacrificial gate electrode structure in the MV region, and a third sacrificial gate electrode structure in the HV region. FIGS. 14A and 14B illustrate a cross-sectional view 1400*a* and top view 1400*b* corresponding to some embodiments of act 2112.

At act 2114, a pair of HV source/drain regions is formed on opposing sides of the third sacrificial gate electrode structure, a pair of source/drain regions is formed on opposing sides of the second sacrificial gate electrode structure, and a pair of LV source/drain regions is formed on opposing sides of the first sacrificial gate electrode structure. FIG. 16 illustrates a cross-sectional view 1600 corresponding to some embodiments of act 2114.

At act 2116, a LV gate electrode structure, a gate electrode structure, and a HV gate electrode structure are formed in place of the first, second, and third sacrificial gate electrode structures, respectively. The gate electrode structure is laterally offset from a pair of isolation edges of the isolation structure that extend between the pair of source/drain regions, and the LV and HV gate electrode structures respectively directly overlie other isolation edges of the isolation structure. FIGS. 18A, 18B, and 18C illustrate cross-sectional views 1800*a* and 1800*b* and a top view 1800*c* corresponding to some embodiments of act 2116.

At act 2118, a plurality of conductive contacts and a plurality of conductive wires are formed over the substrate. FIGS. 19 and 20 illustrate cross-sectional views 1900 and 2000 corresponding to some embodiments of act 2118.

Accordingly, in some embodiments, the present disclosure relates to a transistor having a gate electrode structure spaced between a pair of isolation edges of an STI structure, where the pair of isolation edges are elongated in a first direction extending between a pair of source/drain regions that are disposed on opposing sides of the gate electrode structure.

In some embodiments, the present application provides an integrated chip including: an isolation structure extending into a front-side surface of a substrate, wherein the isolation structure laterally encloses a first device region of the substrate, wherein the isolation structure comprises a pair of isolation edges elongated in a first direction and at least partially defining the first device region; a pair of source/drain regions disposed within the first device region and laterally spaced from one another in the first direction; and a first gate electrode structure disposed in the first device region and spaced between the pair of source/drain regions, wherein the first gate electrode structure comprises a first pair of opposing sidewalls elongated in the first direction, wherein the opposing sidewalls are laterally offset from a corresponding isolation edge in the pair of isolation edges by a non-zero distance in a direction towards a center of the first gate electrode structure.

In some embodiments, the present application provides an integrated chip including a semiconductor substrate having a first device region laterally adjacent to a second device region; a shallow trench isolation (STI) structure extending into a front-side surface of the semiconductor substrate, wherein the STI structure comprises a first pair of isolation edges elongated in a first direction and at least partially demarcating the first device region and a second pair of isolation edges elongated in the first direction and at least partially demarcating the second device region; a first transistor disposed within the first device region, wherein the first transistor comprises a first gate electrode structure and a first pair of source/drain regions disposed on opposing sides of the first gate electrode structure, wherein the first gate electrode structure is elongated in a second direction orthogonal to the first direction and directly overlies the first pair of isolation edges; and a second transistor disposed within the second device region, wherein the second transistor comprises a second gate electrode structure and a second pair of source/drain regions disposed on opposing sides of the second gate electrode structure, wherein the second gate electrode structure comprises a pair of opposing sidewalls elongated in the first direction, wherein the opposing sidewalls of the second gate electrode structure are spaced between the second pair of isolation edges.

In some embodiments, the present application provides a method for forming an integrated chip, the method including: forming an isolation structure extending into a front-side surface of a substrate, wherein the isolation structure comprises a pair of isolation edges, wherein the isolation edges each extend in a first direction and at least partially define a first device region of the substrate; forming a first gate dielectric structure recessed in the substrate and continuously laterally extending between the pair of isolation edges; forming a first gate electrode structure over the first gate dielectric structure, wherein the first gate electrode structure comprises a first pair of opposing sidewalls, wherein the opposing sidewalls extend in the first direction and are parallel to one another, wherein the opposing sidewalls are respectively separated from an adjacent isolation edge in the pair of isolation edges by a lateral distance; and performing an ion implantation process to form a pair of source/drain regions on opposing sides of the first gate electrode structure, wherein the source/drain regions extend in a second direction orthogonal to the first direction.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming an integrated chip, comprising:

forming an isolation structure extending into a front-side surface of a substrate, wherein the isolation structure comprises a pair of isolation edges, wherein the isolation edges each extend in a first direction and at least partially define a first device region of the substrate;

forming a first gate dielectric structure recessed in the substrate and continuously laterally extending between the pair of isolation edges;

forming a first gate electrode structure over the first gate dielectric structure, wherein the first gate electrode structure comprises a first pair of opposing sidewalls, wherein the opposing sidewalls extend in the first direction and are parallel to one another, wherein the opposing sidewalls are respectively separated from an adjacent isolation edge in the pair of isolation edges by a lateral distance; and performing an ion implantation process to form a pair of source/drain regions on opposing sides of the first gate electrode structure, wherein the source/drain regions extend in a second direction orthogonal to the first direction.

2. The method of claim 1, further comprising:

forming a second gate electrode structure over a second device region of the substrate, wherein the isolation structure demarcates the second device region of the substrate, and wherein the second gate electrode structure directly overlies at least a portion of the isolation structure.

3. The method of claim 2, wherein the first gate electrode structure and the second gate electrode structure are formed concurrently.

4. The method of claim 1, wherein the first gate dielectric structure continuously laterally extends from the first pair of opposing sidewalls to the pair of isolation edges.

5. The method of claim 1, further comprising:

forming a sidewall spacer structure around the first gate electrode structure, wherein a lateral thickness of the sidewall spacer structure is less than the lateral distance.

6. The method of claim 5, wherein the sidewall spacer structure contacts a top surface of the first gate dielectric structure.

7. The method of claim 5, wherein first outer sidewalls of the sidewall spacer structure are aligned with first outer sidewalls of the first gate dielectric structure in a first cross-sectional view taken along the first direction, wherein second outer sidewalls of the sidewall spacer structure are spaced between second outer sidewalls of the first gate dielectric structure in a second cross-sectional view taken along the second direction.

8. The method of claim 1, wherein the first gate electrode structure comprises a lateral segment extending over a first edge of the pair of isolation edges in a top view, wherein the lateral segment is elongated in the second direction and has a width less than a length of an adjacent one of the first pair of opposing sidewalls.

9. The method of claim 8, further comprising:

forming a first conductive contact over the lateral segment, wherein the first conductive contact is laterally offset from the adjacent one of the first pair of opposing sidewalls.

10. A method for forming an integrated chip, comprising:

etching a substrate to form one or more trenches extending into a first surface of the substrate;

depositing an isolation structure in the one or more trenches, wherein the isolation structure comprises a first pair of isolation edges extending in a first direction and a second pair of isolation edges extending in a second direction substantially orthogonal to the first direction, wherein the first pair of isolation edges and the second pair of isolation edges demarcate a first device region;

forming a first gate dielectric structure in the substrate, wherein the first gate dielectric structure comprises a first pair of opposing sidewalls extending in the first direction and contacting the first pair of isolation edges;

forming a first gate electrode structure on the first gate dielectric structure, wherein the first gate electrode structure comprises a second pair of opposing sidewalls extending in the first direction and spaced between the first pair of opposing sidewalls of the first gate dielectric structure; and performing a doping process to form a pair of source/drain regions in the substrate between the first gate dielectric structure and the second pair of isolation edges.

11. The method of claim 10, wherein a distance between the second pair of opposing sidewalls is less than a length of an individual source/drain region of the pair of source/drain regions in the second direction.

12. The method of claim 10, further comprising:

forming a pair of lightly doped regions in the substrate and under the pair of source/drain regions, wherein the pair of lightly doped regions extend from a corresponding one of the second pair of isolation edges to a bottom surface of the first gate dielectric structure.

13. The method of claim 10, further comprising:

forming a second gate dielectric structure over a second device region laterally adjacent to the first device region, wherein the second gate dielectric structure contacts an upper surface of the substrate, wherein a bottom surface of the first gate dielectric structure is below the upper surface of the substrate; and forming a second gate electrode structure over the second gate dielectric structure, wherein the second gate electrode structure overhangs segments of the isolation structure abutting the second device region.

14. The method of claim 13, wherein a length of the second gate electrode structure in the second direction is greater than a distance between the second pair of opposing sidewalls of the first gate electrode structure, wherein a width of the second gate electrode structure is less than a width of the first gate electrode structure in the first direction.

15. The method of claim 13, wherein a thickness of the second gate dielectric structure is less than a distance between a first sidewall of the first pair of opposing sidewalls and an adjacent one of the second pair of opposing sidewalls.

16. A method for forming an integrated chip, comprising:

forming an isolation structure in a substrate, wherein the isolation structure comprises a first pair of isolation segments elongated in a first direction and a second pair of isolation segments elongated in the first direction, wherein the first pair of isolation segments at least partially demarcate a first device region and the second pair of isolation segments at least partially demarcate a second device region;

forming a first gate dielectric structure in the first device region, wherein the first gate dielectric structure contacts the first pair of isolation segments;

forming a first gate electrode structure over the first gate dielectric structure, wherein the first gate electrode structure is spaced laterally between the first pair of isolation segments in a second direction substantially orthogonal to the first direction;

forming a second gate dielectric structure in the second device region, wherein the second gate dielectric structure contacts the second pair of isolation segments and has a thickness greater than a thickness of the first gate dielectric structure; and forming a second gate electrode structure over the second gate dielectric structure, wherein the second gate electrode structure overlies the second pair of isolation segments in the second direction.

17. The method of claim 16, wherein a first sidewall of the first gate electrode structure facing a first isolation segment of the first pair of isolation segments is laterally offset from the first isolation segment by a first distance towards a center of the first gate electrode structure.

18. The method of claim 17, wherein the first distance is greater than the thickness of the first gate dielectric structure and is less than the thickness of the second gate dielectric structure.

19. The method of claim 16, further comprising:

forming a first pair of source/drain regions in the first device region and on opposing sides of the first gate electrode structure in a cross-sectional view taken along the first direction, wherein the first pair of source/drain regions contact the first gate dielectric structure; and forming a second pair of source/drain regions in the second device region and on opposing sides of the second gate electrode structure in the cross-sectional view, wherein the second pair of source/drain regions are laterally separated from the second gate dielectric structure by inner segments of the isolation structure.

20. The method of claim 16, wherein a bottom surface of the second gate dielectric structure is below a bottom surface of the first gate dielectric structure.

* * * * *